(12) United States Patent
An et al.

(10) Patent No.: US 10,916,620 B2
(45) Date of Patent: Feb. 9, 2021

(54) DISPLAY DEVICE AND MANUFACTURING METHOD THEREOF

(71) Applicant: Samsung Display Co., LTD., Yongin-si (KR)

(72) Inventors: Jin Sung An, Seongnam-si (KR); Young Woo Park, Yongin-si (KR); Se Wan Son, Yongin-si (KR); Moo Soon Ko, Seoul (KR); Jeong-Soo Lee, Hwaseong-si (KR); Ji Seon Lee, Hwaseong-si (KR); Deuk Myung Ji, Osan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/799,296

(22) Filed: Feb. 24, 2020

(65) Prior Publication Data
US 2020/0381504 A1    Dec. 3, 2020

(30) Foreign Application Priority Data
May 31, 2019    (KR) .......................... 10-2019-0064345

(51) Int. Cl.
*H01L 27/32* (2006.01)
*H01L 51/56* (2006.01)
(Continued)

(52) U.S. Cl.
CPC ....... *H01L 27/3276* (2013.01); *G09G 3/3266* (2013.01); *G09G 3/3275* (2013.01);
(Continued)

(58) Field of Classification Search
None
See application file for complete search history.

(56) References Cited

U.S. PATENT DOCUMENTS 8,711,138 B2    4/2014  Kawabe
9,941,340 B2 *  4/2018  Lee ..................... H01L 27/3272
(Continued)

FOREIGN PATENT DOCUMENTS

JP    4877873      2/2012
KR    10-1808432   1/2018
(Continued)

*Primary Examiner* — J. E. Schoenholtz
(74) *Attorney, Agent, or Firm* — Kile Park Reed & Houtteman PLLC

(57) ABSTRACT

A display device including: a substrate; an active layer, and including channel and conductive regions and; a first conductive layer including a driving gate electrode and a scan line in a first direction; a second conductive layer including a storage line; a third conductive layer including a first connecting member above the storage line; an insulating layer between the storage line and the first connecting member; and a data line and a driving voltage line crossing the scan line in a second direction, wherein the first connecting member electrically connects the driving gate electrode and a conductive region, the driving voltage line overlaps the first connecting member, the insulating layer includes first and second sub-insulating layers, and an edge of the second sub-insulating layer substantially overlaps an edge of the first connecting member in a thickness direction of the display device.

24 Claims, 39 Drawing Sheets

(51) Int. Cl.
 G09G 3/3275 (2016.01)
 H01L 51/52 (2006.01)
 G09G 3/3266 (2016.01)

(52) U.S. Cl.
 CPC .......... H01L 51/5253 (2013.01); H01L 51/56 (2013.01); *H01L 2251/301* (2013.01)

(56) References Cited

U.S. PATENT DOCUMENTS

| | | | |
|---|---|---|---|
| 9,941,345 B2* | 4/2018 | Choi | H01L 27/3276 |
| 2016/0247452 A1* | 8/2016 | Lee | H01L 27/3272 |
| 2017/0005156 A1* | 1/2017 | Kim | H01L 27/3262 |

FOREIGN PATENT DOCUMENTS

| | | |
|---|---|---|
| KR | 10-2018-0011982 | 2/2018 |
| KR | 10-2018-0012442 | 2/2018 |

* cited by examiner

DISPLAY DEVICE AND MANUFACTURING METHOD THEREOF

CROSS-REFERENCE TO RELATED APPLICATION(S)

This application claims priority to and benefits of Korean Patent Application No. 10-2019-0064345 under 35 U.S.C. § 119, filed in the Korean Intellectual Property Office on May 31, 2019, the entire contents of which are incorporated herein by reference.

BACKGROUND

(a) Technical Field

The disclosure relates to a display device and a manufacturing method of a display device, in which a thickness of the display device is minimized.

(b) Description of the Related Art

A display device includes pixels, which may be units for displaying an image. Particularly, a pixel of a display device including a light emitting layer may include a cathode, an anode, and a light emitting diode including a light emitting layer, transistors and at least one capacitor for driving the light emitting diode.

The light emitting diode may include two electrodes and a light emitting layer disposed between the two electrodes. Electrons injected from the cathode as one electrode and holes injected from the anode as another electrode may be combined in the organic light emitting layer to form excitons, thereby emitting light while the excitons emit energy.

The transistors may include at least one switching transistor and at least one driving transistor. The switching transistor may receive a data signal depending on a scan signal and may transmit a voltage depending to the data signal, and the driving transistor may be directly or indirectly connected to the light emitting diode to control an amount of a driving current transmitted to the light emitting diode, so that each pixel may emit light of a desired luminance.

SUMMARY

Embodiments have been made in an effort to provide a display device including an insulating layer with a uniform thickness and having improved display quality, and a manufacturing method thereof.

An embodiment may include a display device including: a substrate; an active layer disposed on the substrate, and including channel regions and conductive regions; a first conductive layer that may be configured to include a driving gate electrode and a scan line extending in a first direction; a second conductive layer that may be configured to include a storage line; a third conductive layer that may be configured to include a first connecting member, disposed above the storage line; an insulating layer that may be disposed between the storage line and the first connecting member; and a data line and a driving voltage line that each may be configured to cross the scan line and extend in a second direction, wherein the first connecting member may electrically connect the driving gate electrode and a conductive region among the conductive regions, the driving voltage line may overlap at least a portion of the first connecting member, the insulating layer may include a first sub-insulating layer and a second sub-insulating layer, and an edge of the second sub-insulating layer substantially may overlap an edge of the first connecting member in a thickness direction of the display device.

The edge of the second sub-insulating layer and the edge of the third conductive layer may be aligned in the thickness direction of the display device.

The edge of the second sub-insulating layer and the edge of the third conductive layer may be offset in the thickness direction of the display device.

The third conductive layer may include a second connecting member, a third connecting member, a fourth connecting member, and an initialization voltage line disposed on a same layer as that of the first connecting member.

The second sub-insulating layer may include a first region configured to overlap the first connecting member; a second region configured to overlap the second connecting member; a third region configured to overlap the third connecting member; a fourth region configured to overlap the fourth connecting member; and a fifth region configured to overlap the initialization voltage line.

The first to fourth regions may be spaced apart from each other in a plan view.

The fifth region may extend along the first direction.

The first sub-insulating layer and the second sub-insulating layer may include different materials.

The first sub-insulating layer may include a silicon oxide, and the second sub-insulating layer may include a silicon nitride.

A thickness of the first sub-insulating layer may be larger than that of the second sub-insulating layer.

The second sub-insulating layer may have a thickness that is in a range of about 900 angstroms to about 1400 angstroms.

The third conductive layer may include a lower layer and an upper layer, the lower layer may include titanium (Ti), and the upper layer may include molybdenum (Mo).

The edge of the second sub-insulating layer may have a tapered shape.

The edge of the second sub-insulating layer may protrude more than an edge of the first connecting member.

An embodiment may include a manufacturing method of a display device, including: forming a semiconductor layer on a substrate; forming a first conductive layer including a scan line extending in a first direction on the semiconductor layer; forming a second conductive layer including a storage line extending in the first direction on the scan line; forming a first sub-insulating material layer and a second sub-insulating material layer on the storage line; and forming a third conductive layer including a first connecting member on the second sub-insulating material layer, wherein a second sub-insulating layer may be formed by etching the second sub-insulating material layer during the forming of the third conductive layer.

The third conductive layer may include a lower layer and an upper layer.

The second sub-insulating material layer may be etched during a process of etching the lower layer.

An etching rate of the second sub-insulating material layer may be greater than that of the lower layer.

An etching rate of the first sub-insulating material layer may be less than that of the lower layer.

The third conductive layer may include a second connecting member, a third connecting member, a fourth connecting member, and an initialization voltage line, and an edge of the second sub-insulating material layer may substantially overlap edges of the second connecting member, the third connecting member, the fourth connecting member, and the initialization voltage line.

The edge of the second sub-insulating material layer may be aligned with each of the edges of the second connecting member, the third connecting member, the fourth connecting member, and the initialization voltage line.

The edge of the second sub-insulating material layer may be offset from each of the edges of the second connecting member, the third connecting member, the fourth connecting member, and the initialization voltage line.

According to embodiments herein, it may be possible to provide a display device including an insulating layer with a uniform thickness, and a manufacturing method thereof. Accordingly, it may be possible to provide a display device with improved display quality, and a manufacturing method thereof.

DETAILED DESCRIPTION OF THE EMBODIMENTS

Figure 1:
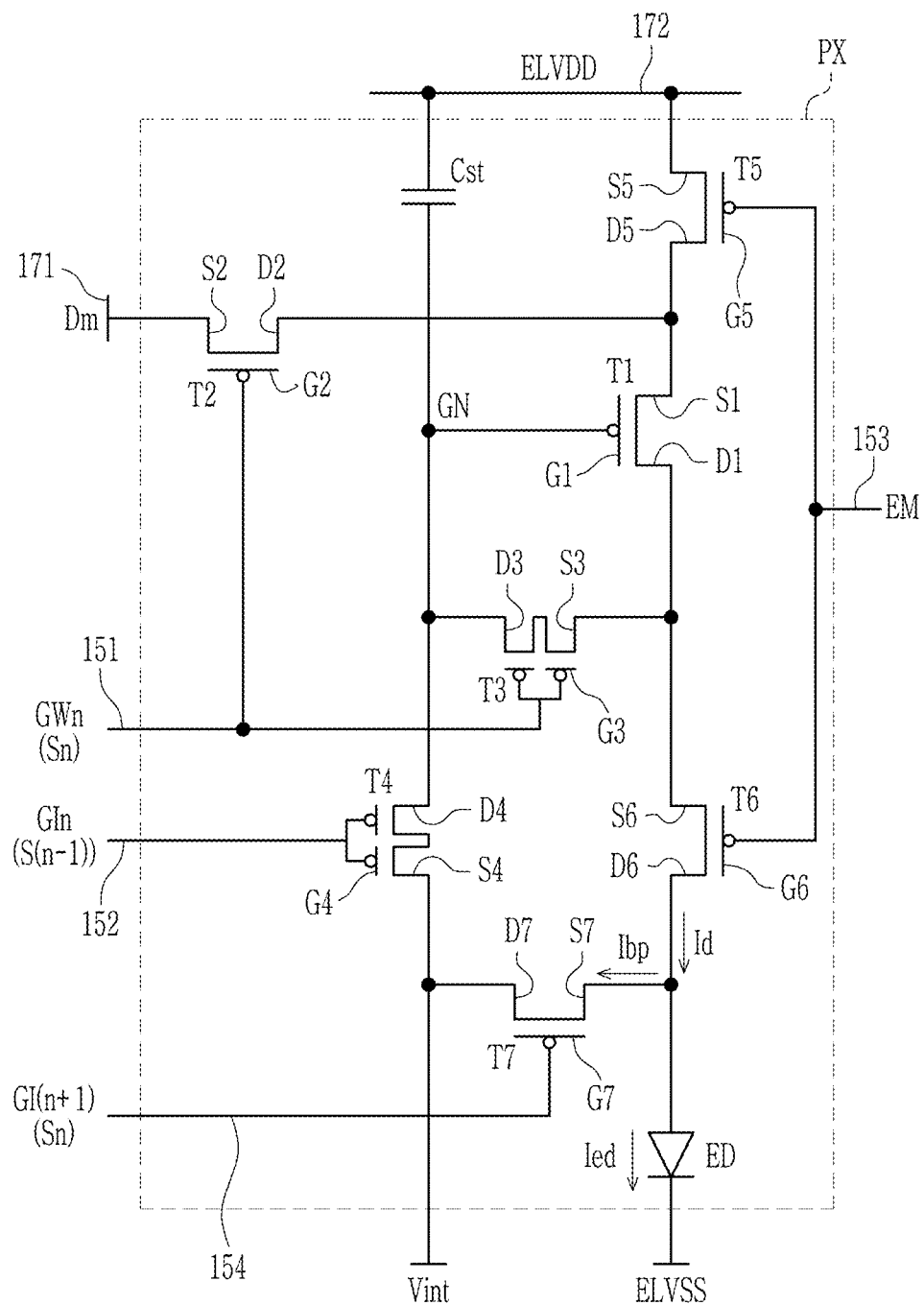
FIG. 1 illustrates a schematic diagram of an equivalent circuit of a pixel of a display device according to an embodiment.

The disclosure will be described more fully hereinafter with reference to the accompanying drawings, in which embodiments are shown. As those skilled in the art may realize, the described embodiments may be modified in various different ways, all without departing from the spirit or scope of the disclosed embodiments.

To clearly describe the embodiments, parts that are irrelevant to the description are omitted, and like numerals refer to like or similar constituent elements throughout the disclosure.

Further, since sizes and thicknesses of constituent members shown in the accompanying drawings may be arbitrarily given for better understanding and ease of description, the embodiments may not be limited to the illustrated sizes and thicknesses. In the figures, the thicknesses of layers, films, panels, regions, etc., may be exaggerated for clarity. In the figures, for better understanding and ease of description, the thicknesses of some layers and areas may be exaggerated.

It will be understood that when an element such as a layer, film, region, or substrate may be referred to as being "on" another element, it may be directly on the other element or intervening elements may also be present. In contrast, when an element is referred to as being "directly on" another element, there may be no intervening elements present. The word "over" or "on" means positioning on or below an object portion, and does not necessarily mean positioning on the upper side of the object portion based on a gravity direction.

Unless explicitly described to the contrary, the word "comprise" and variations such as "comprises" or "comprising" will be understood to imply the inclusion of stated elements but not the exclusion of any other elements. As used herein, the term "and/or" may include any and all combinations of one or more of the associated listed items. Expressions such as "at least one of," when preceding a list of elements, modify the entire list of elements and do not modify the individual elements of the list.

In a case that a certain embodiment may be implemented differently, a specific process order may be performed differently from the described order. For example, two consecutively described processes may be performed substantially at the same time or performed in an order opposite to the described order.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within, for example, ±30%, 20%, or 5% of the stated value.

It will be understood that the terms "first," "second," etc. may be used herein to describe various components, these components should not be limited by these terms. These terms may only be used to distinguish one component from another.

As used herein, the singular forms "a," "an," and "the" are intended to include the plural forms as well, unless the context clearly indicates otherwise.

In the embodiments hereinafter, it will be understood that when an element, an area, or a layer is referred to as being connected to another element, area, or layer, it can be directly or indirectly connected to the other element, area, or layer. For example, it will be understood in this specification that when an element, an area, or a layer is referred to as being in contact with or being electrically connected to another element, area, or layer, it may be directly or indirectly in contact with or electrically connected to the other element, area, or layer.

Further, the phrase "in a plan view" means when an object portion is viewed from above, and the phrase "in a cross-sectional view" means when a cross-section taken by vertically cutting an element portion is viewed from the side. Additionally, the terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. The terms "face" and "facing" mean that a first element may directly or indirectly oppose a second element. In a case in which a third element intervenes between the first and second element, the first and second element may be understood as being indirectly opposed to one another, although still facing each other. When an element is described as 'not overlapping' or 'to not overlap' another element, this may include that the elements are spaced apart from each other, offset from each other, or set aside from each other or any other suitable term as would be appreciated and understood by those of ordinary skill in the art. When a layer, region, substrate, or area, is referred to as being "on" another layer, region, substrate, or area, it may be directly on the other region, substrate, or area, or intervening regions, substrates, or areas, may be present therebetween. Conversely, when a layer, region, substrate, or area, is referred to as being "directly on" another layer, region, substrate, or area, intervening layers, regions, substrates, or areas, may be absent therebetween. Further when a layer, region, substrate, or area, is referred to as being "below" another layer, region, substrate, or area, it may be directly below the other layer, region, substrate, or area, or intervening layers, regions, substrates, or areas, may be present therebetween. Conversely, when a layer, region, substrate, or area, is referred to as being "directly below" another layer, region, substrate, or area, intervening layers, regions, substrates, or areas, may be absent therebetween. Further, "over" or "on" may include positioning on or below an object and does not necessarily imply a direction based upon gravity.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the description.

FIG. 1 illustrates a schematic diagram of an equivalent circuit of a pixel of a display device according to an embodiment.

Referring to FIG. 1, a display device according to an embodiment includes pixels PX capable of displaying an image, and signal lines 151, 152, 153, 154, 171, and 172. Referring to FIG. 1, a pixel PX includes transistors T1, T2, T3, T4, T5, T6, and T7, a capacitor Cst, and at least one light emitting diode ED which may be connected to the signal lines 151, 152, 153, 154, 171, and 172. In the embodiment, the pixel PX may include one light emitting diode ED.

The signal lines 151, 152, 153, 154, 171, and 172 may include scan lines 151, 152, and 154, a control line 153, a data line 171, and a driving voltage line 172.

The scan line 151, 152, and 154 may transfer signals GWn, GIn, and GI(n+1), respectively. The scan signals GWn, Gin, and GI(n+1) may transfer a gate-on voltage and a gate-off voltage that can turn the transistors T2, T3, T4, and T7 included in the pixel PX on or off.

The scan lines 151, 152, and 154 connected to a pixel PX may include a first scan line 151 through which the scan signal Gin may be transferred, a second scan line 152 through which the scan signal Gin having a gate-on voltage may be transferred at a different time from that of the first scan line 151, and a third scan line 154 through which the scan signal GI(n+1) may be transferred. The second scan line 152 may transfer the gate-on voltage at a time that is earlier than the first scan line 151. For example, in a case that the scan signal GWn may be an $n^{th}$ scan signal Sn (n being a natural number that is equal to or greater than 1) among the scan signals applied during one frame, the scan signal GIn may be a previous-stage scan signal such as an $(n-1)^{th}$, and the scan signal GI(n+1) may be an $n^{th}$ scan signal Sn. However, the embodiment may not be limited thereto, and the scan signal GI(n+1) may be a scan signal that may be different from the $n^{th}$ scan signal Sn.

The control line 153 may transfer a control signal, and particularly may transfer a light emission control signal EM capable of controlling light emission of a light-emitting diode ED included in the pixel PX. The control signal transferred by the control line 153 may transfer the gate-on voltage and the gate-off voltage, and may have a waveform that may be different from that of the scan signal transferred by the scan lines 151, 152, and 154.

The data line 171 may transfer a data signal Dm, and the driving voltage line 172 may transfer a driving voltage ELVDD. The data signal Dm may have a different voltage level depending on an image signal inputted into the display device, and the driving voltage ELVDD may have a substantially constant level.

Although not illustrated, the display device may further include a driver that may transfer signals to the signal lines 151, 152, 153, 154, 171, and 172.

The transistors T1, T2, T3, T4, T5, T6 and T7 included in one pixel PX may include a first transistor T1, a second transistor T2, a third transistor T3, a fourth transistor T4, a fifth transistor T5, a sixth transistor T6, and a seventh transistor T7.

The first scan line 151 may transfer the scan signal GWn to the second transistor T2 and the third transistor T3. The second scan line 152 may transfer the scan signal GIn to the fourth transistor T4. The third scan line 154 may transmit the scan signal GI(n+1) to the seventh transistor T7. The control line 153 may transfer the light emission control signal EM to the fifth transistor T5 and the sixth transistor T6.

The gate electrode G1 of the first transistor T1 may be connected to a first end of the capacitor Cst through a driving gate node GN, a first electrode S1 of the first transistor T1 may be connected to the driving voltage line 172 via the fifth transistor T5, and a second electrode D1 of the first transistor T1 may be connected to an anode of the light-emitting diode ED via the sixth transistor T6. The first transistor T1 may receive the data signal Dm transferred by the data line 171 according to a switching operation of the second transistor T2 to supply a driving current Id to the light-emitting diode ED.

The gate electrode G2 of the second transistor T2 may be connected to the first scan line 151. A first electrode S2 of the second transistor T2 may be connected to the data line 171. A second electrode D2 of the second transistor T2 may be connected to the first electrode Si of the first transistor T1 and may be connected to the driving voltage line 172 via the fifth transistor T5. The second transistor T2 may be turned on depending on the scan signal GWn received through the first scan line 151 to transfer the data signal Dm transferred from the data line 171 to the first electrode S1 of the first transistor T1.

A gate electrode G3 of the third transistor T3 may be connected to the first scan line 151, and a first electrode S3 of the third transistor T3 may be connected to the second electrode D1 of the first transistor T1 and may be connected to the anode of the light emitting diode ED via the sixth transistor T6. A second electrode D3 of the third transistor T3 may be connected to a second electrode D4 of the fourth transistor T4, the first end of the capacitor Cst, and the gate electrode G1 of the first transistor T1. The third transistor T3 may be turned on depending on the scan signal GWn transferred through the first scan line 151 to connect the gate electrode G1 and the second electrode D1 of the first transistor T1 to each other, such that the first transistor T1 can be diode-connected.

The gate electrode G4 of the fourth transistor T4 may be connected to the second scan line 152, a first electrode S4 of the fourth transistor T4 may be connected to a terminal of an initialization voltage Vint, and a second electrode D4 of the fourth transistor T4 may be connected to a first end of the capacitor Cst via the second electrode D3 of the third transistor T3 and may be connected to the gate electrode G1 of first transistor T1. The fourth transistor T4 may be turned on in response to the scan signal GIn received through the second scan line 152 to transfer the initialization voltage Vint to the gate electrode G1 of the first transistor T1, in order to perform an initializing operation for initializing a voltage of the gate electrode G1 of the transistor T1.

The gate electrode G5 of the fifth transistor T5 may be connected to the control line 153, a first electrode S5 of the fifth transistor T5 may be connected to the driving voltage line 172, and a second electrode D5 of the fifth transistor T5 may be connected to the first electrode S1 of the first transistor T1 and may be connected to the second electrode D2 of the second transistor T2.

A gate electrode G6 of the sixth transistor T6 may be connected to the control line 153, and a first electrode S6 of the sixth transistor T6 may be connected to the first electrode S3 of the first transistor T1 and the first electrode S3 of the third transistor T3. A second electrode D6 of the sixth transistor T6 may be electrically connected to the anode of the light-emitting diode ED. The fifth transistor T5 and the sixth transistor T6 may be simultaneously turned on depending on the light emission control signal EM transferred through the control line 153, thereby the driving voltage ELVDD may be compensated through the diode-connected first transistor T1 to be transmitted to the light-emitting diode ED.

A gate electrode G7 of the seventh transistor T7 may be connected to the third scan line 154, and a first electrode S7 of the seventh transistor T7 may be connected to the second electrode D6 of the sixth transistor T6 and the anode of the light-emitting diode ED. A second electrode D7 of the seventh transistor T7 may be connected to the terminal of the initialization voltage Vint terminal and the first electrode S4 of the fourth transistor T4.

The transistors T1, T2, T3, T4, T5, T6, and T7 may be P-type channel transistors such as PMOS transistors, but the disclosure may not be limited thereto. For example, at least one of the T1, T2, T3, T4, T5, T6, and T7 may be an N-type channel transistor.

A first end of the capacitor Cst may be connected to the gate electrode G1 of the first transistor T1 as described above, and a second end may be connected to the driving voltage line 172. A cathode of the light-emitting diode ED may be connected to the terminal of the common voltage ELVSS for transferring the common voltage ELVSS to receive the common voltage ELVSS.

The structure of a pixel PX according to an embodiment may not be limited to the structure illustrated in FIG. 1, and numbers of the transistors and capacitors included in one pixel PX and a connection relationship thereof may be variously modified.

An operation of a display device according to an embodiment follows below with reference to FIG. 1.

In a case that the scan signal GIn of the gate-on voltage level may be supplied through the second scan line 152 during an initialization period (the scan signal GIn may be an $(n-1)^{th}$ scan signal S(n−1)), the fourth transistor T4 may be turned on, the initialization voltage Vint may be transmitted to the gate electrode G1 of the first transistor T1 through the fourth transistor T4, and the first transistor T1 may be initialized by the initialization voltage Vint.

In a case that the scan signal GWn of the gate-on voltage level may be supplied through the first scan line 151 during a data programming and compensation period (the scan signal GWn may be an $n^{th}$ scan signal), the second transistor T2 and the third transistor T3 may be turned on. The first transistor T1 may be diode-connected by the turned-on third transistor T3 and may be biased in a forward direction. Accordingly, a compensation voltage that may be decreased by a threshold voltage Vth of the first transistor T1 from the data signal Dm supplied from the data line 171 may be applied to the gate electrode G1 of the first transistor T1. The driving voltage ELVDD and the compensation voltage may be respectively applied to opposite terminals of the capacitor Cst, and the capacitor Cst may be charged with a charge corresponding to a voltage difference of the opposite terminals.

The light emission control signal EM supplied from the control line 153 may be changed from the gate-off voltage level to the gate-on voltage level during the light emission period, and the change point may be after the scan signals GWn may be applied to all the first scan lines 151 in one frame. Thus, during the light emitting period, the fifth transistor T5 and the sixth transistor T6 may be turned on, a driving current Id may be generated according to the voltage difference between the gate voltage of the gate electrode G1 of the first transistor T1 and the driving voltage ELVDD, and the driving current Id may be supplied to the light emitting diode (LED) ED through the sixth transistor T6, thereby a current Ied may flow to the light emitting diode ED.

During an initialization period, the seventh transistor T7 may receive the scan signal GI(n+1) of the gate-on voltage level through the third scan line 154 to be turned on. The scan signal GI(n+1) may be the n-th scan signal Sn. Some of the driving current Id may flow out through the turned-on seventh transistor T7 as a bypass current Ibp.

A description of a configuration of the display device according to an embodiment follows below with reference to FIG. 2 to FIG. 8 along with FIG. 1

For ease of understanding, a description of planar configuration of the display device according to an embodiment, and then a discussion of schematic cross-sectional configuration of the display device follow below.

Figure 2:
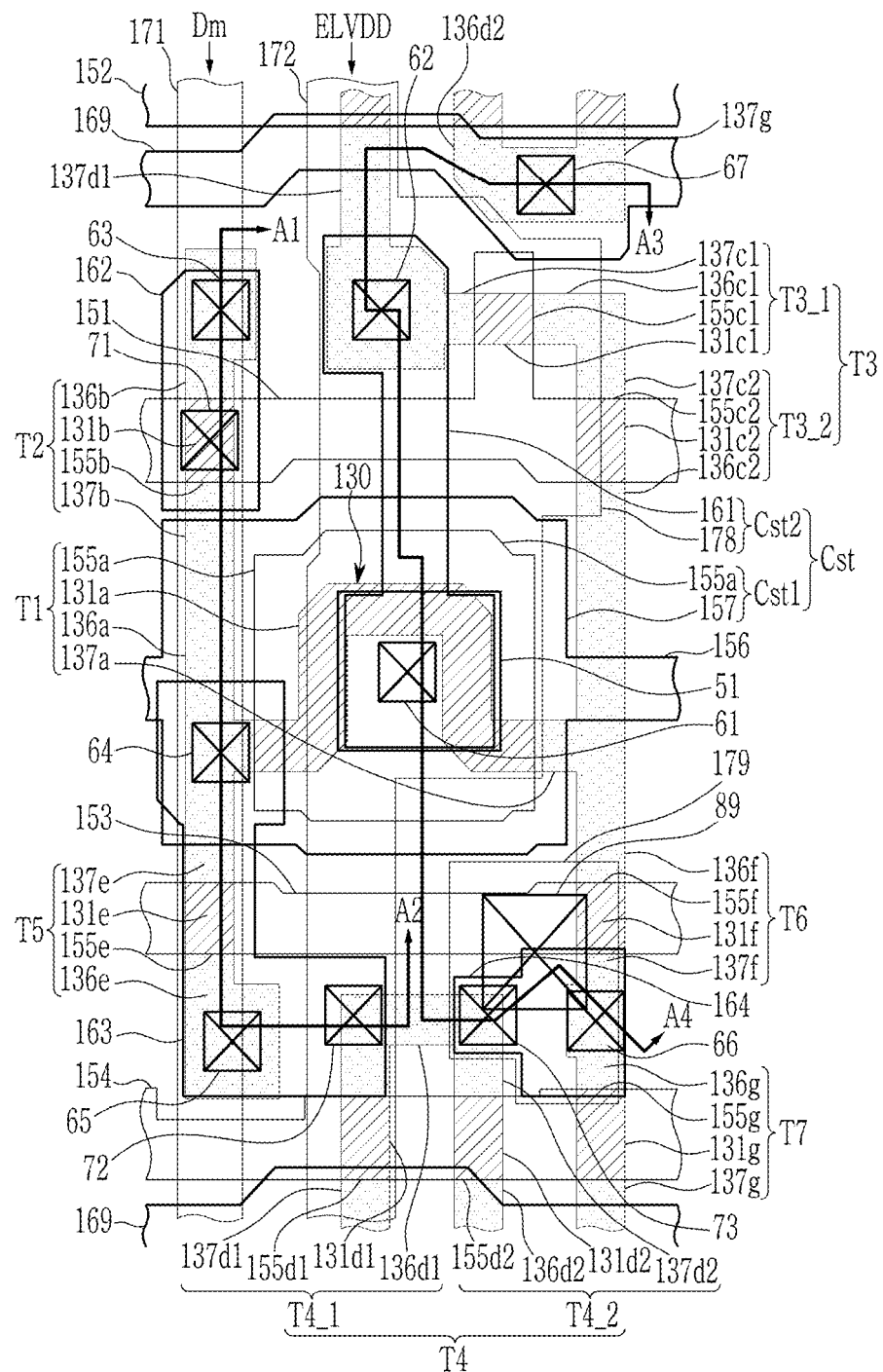
FIG. 2 illustrates a layout view of a pixel of a display device according to an embodiment.

Referring to FIG. 2, a pixel of the display device according to an embodiment may include transistors T1, T2, T3, T4, T5, T6, and T7 and a capacitor Cst that may be connected to scan lines 151, 152, and 154, a control line 153, a data line 171, and a driving voltage line 172. The configuration illustrated in FIG. 2 may be disposed to be repeated in a horizontal direction and a vertical direction.

The scan lines 151, 152, and 154 and the control line 153 may extend in substantially a same direction (e.g., horizontal direction) in a plan view. The first scan line 151 may be disposed between the second scan line 152 and the control line 153 in the plan view. The third scan line, which may be a scan line of a same type as the second scan line 152, may transfer a scan signal GI(n+1) of a next stage of a scan signal GIn transferred by the second scan line 152.

The data line 171 and the driving voltage line 172 may extend generally in the vertical direction in a plan view, to cross the scan lines 151, 152, and 154 and the control line 153. The data line 171 may transfer a data signal Dm, and the driving voltage line 172 may transfer a driving voltage ELVDD. The driving voltage line 172 may include an extension 178 disposed at each pixel. The extension 178 may be extended in a direction that may be perpendicular to an extended direction of the driving voltage line 172.

The display device according to an embodiment may further include a storage line 156 and an initialization voltage line 169.

The storage line 156 and the initialization voltage line 169 may extend generally in a horizontal direction in the plan view. The storage line 156 may be disposed between the first scan line 151 and the control line 153 in the plan view. The storage line 156 may include an extension 157 disposed at each pixel. The storage line 156 may transfer the driving voltage ELVDD. The extension 157 may include an opening 51 that may be substantially centrally positioned.

The initialization voltage line 169 transfers the initialization voltage Vint, and most regions of one initialization voltage line 169 may be disposed between the first scan line 151 and the second scan line 152, but the disclosure may not be limited thereto. As illustrated in an upper portion of FIG. 2, the initialization voltage line 169 may be adjacent to or may overlap or face the second scan line 152 in a plan view.

The scan lines 151, 152, and 154 and the control line 153 may be included in the first conductive layer (including 151, 152, 153, 154, and a driving gate electrode155a) to be disposed on a same layer in a cross-section, and may include a same material. The storage line 156 may be included in the second conductive layer (156 and extension 157 of the storage line 156) which may be different from the first conductive layer (151, 152, 153, 154, and 155a). For example, the second conductive layer (156 and 157) may be disposed in a layer above the first conductive layer (151, 152, 153, 154, and 155a). The initialization voltage line 169 may be included in a third conductive layer (including 161,162, 163, 164, as discussed below, and 169), which may be different from the first conductive layer (151, 152, 153, 154 and 155a) and the second conductive layer (156 and 157). For example, the third conductive layer (161, 162, 163, 164, and 169) may be disposed on a layer above the second conductive layer (156 and 157). The data line 171 and the driving voltage line 172 may be included in a fourth conductive layer (including 171, 172, and a connecting member179), which may be different from the first to third conductive layers to be disposed on a same layer in a cross-section, and may include a same material. For example, the fourth conductive layer (171, 172, and 179) may be disposed in a layer above the third conductive layer (161, 162, 163, 164, and 169).

As such, the initialization voltage line 169 may be disposed in the third conductive layer (161, 162, 163, 164, and 169) which may be different from the first conductive layer (151, 152, 153, 154, and 155a) in which the scan lines 151, 152, and 154, the control line 153, and the like, are disposed. Thus, a distance between the initialization voltage line 169 and the scan lines 151, 152, and 154 may be minimized in a plan view, and further an overlap or facing between the initialization voltage line 169 and the second scan line 152 may be demonstrated in the plan view. Therefore, use of available space and freedom of component design within the display device may be optimized, thereby facilitating the manufacture of a high resolution display device.

Since a voltage difference between a voltage transferred by the initialization voltage line 169 and a voltage transferred by scan lines 151, 152, and 154 or the control line 153 may be large, in a case that the initialization voltage line 169 may be adjacent to the scan lines 151, 152, and 154 or the control line 153 an only one insulating layer may be disposed therebetween, there may be a high risk of damaging the insulating layer. However, according to the embodiment herein, second and third insulating layers 142 and 143 may be disposed between the third conductive layer (161, 162, 163, 164, and 169) in which the initialization voltage line 169 may be disposed and the first conductive layer (151, 152, 153, 154, and 155a) such as the scan lines 151, 152, and 154 or the control line 153, and thus a sufficient distance in cross-section between the initialization voltage line 169 and the second scan line 152 may be secured to reduce the risk of a short circuit, and the distance between the initialization voltage line 169 and the second scan line 152 may be minimized in the plan view.

A channel of each of the transistors T1, T2, T3, T4, T5, T6, and T7 may be formed inside one active layer 130, and the active layer 130 may be curved in various shapes. The active layer 130 may be made of a semiconductor material such as amorphous/polycrystalline silicon or an oxide semiconductor.

The active layer 130 may include channel regions and conductive regions, which may be semiconductors. The channel region may include channel regions 131a, 131b, 131c1, 131c2, 131d1, 131d2, 131e, 131f, and 131g forming respective channels of the transistors T1, T2, T3, T4, T5, T6, and T7. The remaining portion of the active layer 130 except for the channel regions 131a, 131b, 131c1, 131c2, 131d1, 131d2, 131e, 131f, and 131g may serve as a conductive region. The conductive region may have a carrier concentration that may be higher than that of the channel regions 131a, 131b, 131c1, 131c2, 131d1, 131d2, 131e, 131f, and 131g. A pair of conductive regions disposed at opposite sides of the channel regions 131a, 131b, 131c1, 131c2, 131d1, 131d2, 131e, 131f, and 131g may serve as a first electrode and a second electrode of corresponding transistors T1, T2, T1, T2, T3, T4, T5, T6, and T7.

The first transistor T1 may include a channel region 131a, a first electrode 136a and a second electrode 137a disposed at opposite sides of the channel region 131a, and a driving gate electrode 155a overlapping or facing the channel region 131a in a plan view.

The channel region 131a may be bent at least once. For example, the channel region 131a may have a meandering shape or a zigzag shape. FIG. 2 illustrates an example in which the channel region 131a may include a U-shape that may be inverted substantially up and down.

The driving gate electrode 155a may be included in the first conductive layer (151, 152, 153, 154, and 155a) described above, and may be connected to a first connecting member 161 through a contact hole 61. The contact hole 61 may be positioned in the opening 51 of the extension 157 of the storage line 156. The first connecting member 161 may be included in the third conductive layer (161, 162, 163, 164, and 169) in a cross-section. The first connecting member 161 may generally extend in the vertical direction to intersect the first scan line 151. The connecting member 161 may correspond to a driving gate node GN (illustrated in FIG. 1) together with the driving gate electrode 155a.

The second transistor T2 may include a channel region 131b, a first electrode 136b and a second electrode 137b disposed at opposite sides of the channel region 131b, and a gate electrode 155b overlapping or facing the channel region 131b in a plan view. The gate electrode 155b may be a portion of the first scan line 151. The first electrode 136b may be connected with the second connecting member 162 through a contact hole 63, and the second electrode 137b may be connected with the first electrode 136a of the first transistor T1.

The second connecting member 162 may be included in the third conductive layer (161, 162, 163, 164, and 169) in a cross-section. Since the second connecting member 162 may be connected with the data line 171 through a contact hole 71, the first electrode 136b may be electrically connected to the data line 171 to receive the data signal Dm.

The third transistor T3 may be formed in two parts to prevent a leakage current. For example, the third transistor T3 may include a third transistor first part T3_1 and a third transistor second part T3_2 that may be adjacent to and connected to each other.

The third transistor first portion T3_1 may include a channel region 131c1 overlapping or facing the first scan line 151 in a plan view, a first electrode 136c1 and a second electrode 137c1 disposed at opposite sides of the channel region 131c1, and a gate electrode 155c1 overlapping or facing the channel region 131c1. The gate electrode 155c1 may be a portion of a protrusion of the first scan line 151. The second electrode 137c1 may be connected to the first connecting member 161 through a contact hole 62.

The third transistor second portion T3_2 may include a channel region 131c2 overlapping or facing the first scan line 151 in a plan view, a first electrode 136c2 and a second electrode 137c2 disposed at opposite sides of the channel region 131c2, and a gate electrode 155c2 overlapping or facing the channel region 131c2. The gate electrode 155c2 may be a portion of the first scan line 151. The first electrode 136c2 of the third transistor second portion T3_2 may be connected with the second electrode 137a of the first transistor T1, and the second electrode 137c2 may be connected with the first electrode 136c1 of the third transistor first portion T3_1.

The fourth transistor T4 may also be formed in two parts to prevent a leakage current. For example, the fourth transistor T4 may include a fourth transistor first part T4_1 and a fourth transistor second part T4_2 that may be adjacent to and connected to each other. Although the fourth transistor first portion T4_1 and the fourth transistor second portion T4_2 may be disposed where the second scan line 152 illustrated in FIG. 2 passes, the third scan line 154, which may be the next stage of the second scan line 152, thereby demonstrating possible repetition with respect to the scan line configuration.

The fourth transistor first portion T4_1 may include a channel region 131d1 overlapping or facing the second scan line 152 or the first scan line 154 in a plan view, a first electrode 136d1 and a second electrode 137d1 disposed at opposite sides of the channel region 131d1, and a gate electrode 155d1 overlapping or facing the channel region 131d1. The gate electrode 155d1 may be a portion of the second scan line 152 (or the third scan line 154). The second electrode 137d1 may be connected with the second electrode 137c1 of the third transistor first portion T3_1, and may be connected with the first connecting member 161 through the contact hole 62.

The fourth transistor second portion T4_2 may include a channel region 131d2 overlapping or facing the second scan line 152 or the first scan line 154 in a plan view, a first electrode 136d2 and a second electrode 137d2 disposed at opposite sides of the channel region 131d2, and a gate electrode 155d2 overlapping or facing the channel region 131d2. The gate electrode 155d2 may be a portion of the second scan line 152 (or the third scan line 154). The second electrode 137d2 may be connected with the second electrode 136d1 of the third transistor first portion T4_1, and the first electrode 136d2 may be connected with the initialization voltage line 169 through a contact hole 67.

The fifth transistor T5 may include a channel region 131e, a first electrode 136e and a second electrode 137e disposed at opposite sides of the channel region 131e, and a gate electrode 155e overlapping or facing the channel region 131e. The gate electrode 155e may be a portion of the control line 153. The first electrode 136e may be connected with the third connecting member 163 through a contact hole 65, and the second electrode 137e may be connected with the first electrode 136a of the first transistor T1.

A third connecting member 163 may be included in the third conductive layer (161, 162, 163, 164, and 169), as illustrated in a cross-sectional view. Since the third connecting member 163 may extend in the horizontal direction to be connected to the driving voltage line 172 through a contact hole 72, the first electrode 136e may be electrically connected to the driving voltage line 172 to receive the driving voltage ELVDD. The third connecting member 163 may extend in the vertical direction to be connected with the extension 157 of the storage line 156 through a contact hole 64 to transmit the driving voltage ELVDD to the storage line 156.

The sixth transistor T6 may include a channel region 131f, a first electrode 136f and a second electrode 137f disposed at opposite sides of the channel region 131f, and a gate electrode 155f overlapping or facing the channel region 131f. The gate electrode 155f may be a portion of the control line 153. The second electrode 136f may be connected with the second electrode 137a of the first transistor T1, and the second electrode 137f may be connected with the fourth connecting member 164 through a contact hole 66.

The fourth connecting member 164 may be included in the third conductive layer (161, 162, 163, 164, and 169), as illustrated in a cross-sectional view. The fourth connecting member 164 may be connected to a connecting member 179 disposed in the fourth conductive layer (171, 172, and 179) through a contact hole 73.

The seventh transistor T7 may include a channel region 131g, a first electrode 136g and a second electrode 137g disposed at opposite sides of the channel region 131g, and a gate electrode 155g overlapping or facing the channel region 131g. The gate electrode 155g may be a portion of the third scan line 154. The first electrode 136g may be connected with the second electrode 137f of the sixth transistor T6, and the second electrode 137g may be connected with the initialization voltage line 169 through the contact hole 67 (see the upper portion of FIG. 2) to receive the initialization voltage Vint.

The capacitor Cst may maintain a voltage of the driving gate electrode 155a. The capacitor Cst may include first and second sub-capacitors Cst1 and Cst2.

The first sub-capacitor Cst1 may include the driving gate electrode 155a and the extension 157 of the storage line 156 overlapping or facing each other in a plan view as two terminals. The extension 157 of the storage line 156 may have an area that may be wider than that of the driving gate electrode 155a in a plan view, and may cover the entire area of the driving gate electrode 155a.

The second sub-capacitor Cst2 may include the first connecting member 161 and the driving voltage line 172 (including the extension 178) overlapping or facing each other in a plan view as two terminals. The driving voltage line 172 (including the extension 178) may overlap, or face, and cover most of the first connecting member 161 in a plan view. The extension 178 may be appropriately extended in the horizontal direction such that the driving voltage line 172 may overlap or face most of the first connecting member 161.

The driving gate electrode 155a, which may be a first end of the first sub-capacitor Cst1, may be electrically connected to the first connecting member 161, which may be a first end of the second sub-capacitor Cst2 to receive a same voltage. The extension 157 of the storage line 156, which may be a second end of the first sub-capacitor Cst1, may transfer the driving voltage ELVDD like the driving voltage line 172, which may be a second end line of the second sub-capacitor Cst2, and the first and second sub-capacitors Cst1 and Cst2 may have a parallel connection relationship in a circuit. Accordingly, the capacity of the capacitor Cst may be significantly increased even in a narrow space in a plan view, thereby preventing image quality defects such as color deviation between pixels and crosstalk. The capacitance of the capacitor Cst may be effectively secured even in a high-resolution display device to stably maintain the voltage of the driving gate electrode 155a, thereby preventing image quality deterioration.

Referring to FIG. 2, in a plan view, the driving voltage line 172 (including the extension 178) may overlap, or face, and cover the channel region 131a of the first transistor T1, and simultaneously overlap or face at least a portion of the channel regions 131c1 and 131c2 of the third transistor T3. For example, as illustrated in FIG. 2, the extension 178 of the driving voltage line 172 may cover the entire area of the channel region 131c1 of the third transistor first portion T3_1, and may cover some areas of the channel region 131c2 of the third transistor second portion T3_2. The extension 178 may also cover the channel region 131c1 of the third transistor T3_1 and a boundary between the first electrode 136c1 and the second electrode 137c1. Accordingly, external light may be prevented from being introduced into the channel region 131c1 of the third transistor first portion T3_1 that may be directly connected to the driving gate electrode 155a by the driving voltage line 172 to prevent a leakage current from being generated in the third transistor first portion T3_1. Since a voltage variation at the driving gate electrode 155a due to the external light may be prevented, it may be possible to prevent display defects such as a luminance change of an image and a color coordinate variation.

The driving voltage line 172 may cover most of the area of the channel region 131d1 of the fourth transistor first portion T4_1. Accordingly, external light may be prevented from being introduced into the channel region 131d1 of the fourth transistor first portion T4_1 that may be directly connected to the driving gate electrode 155a by the driving voltage line 172 to prevent a leakage current from being generated in the fourth transistor first portion T4_1. Accordingly, since a voltage variation at the driving gate electrode 155a may be prevented, it may be possible to prevent display defects such as a luminance change of an image and a color coordinate variation.

A cross-sectional configuration of a display device according to an embodiment follows below with reference to FIG. 3 and FIG. 4 in addition to FIG. 2.

The display device according to the embodiment may include a substrate 110. The substrate 110 may include an inorganic insulating material such as glass, or an organic insulating material such as plastic, e.g., polyimide (PI). The substrate 110 may have various degrees of flexibility.

A buffer layer 120 may be disposed on the substrate 110. The buffer layer 120 may prevent impurities from being transferred from the substrate 110 to an upper layer of the buffer layer 120, particularly the active layer 130, thereby preventing deterioration of characteristics of the active layer 130 and relieving stress. The buffer layer 120 may include an inorganic insulating material such as a silicon nitride or a silicon oxide, or may include an organic insulating material. A portion or an entire portion of the buffer layer 120 may be omitted.

An active layer 130 as described above may be disposed on the buffer layer 120, and a first insulating layer 141 may be disposed on the active layer 130. The first insulating layer 141 may include an inorganic insulating material such as a silicon nitride or a silicon oxide, or may include an organic insulating material.

A first conductive layer (151, 152, 153, 154, 155a) including scan lines 151, 152, and 154, a control line 153, a driving gate electrode 155a may be disposed on the first insulating layer 141.

A second insulating layer 142 may be disposed on the first conductive layer (151, 152, 153, 154, and 155a) and the first insulating layer 141. The second insulating layer 142 may include an inorganic insulating material such as a silicon nitride or a silicon oxide, or may include an organic insulating material.

A second conductive layer (156 and 157) including a storage line 156 may be disposed on the second insulating layer 142. An extension 157 of the storage line 156 may overlap or the driving gate electrode 155a with the second insulating layer 142 interposed therebetween to form a first sub-capacitor Cst1.

A third insulating layer 143 may be disposed on the second conductive layer (156 and 157) and the second insulating layer 142. The third insulating layer 143 may include an inorganic insulating material such as a silicon nitride or a silicon oxide, or may include an organic insulating material.

The third insulating layer 143 according to an embodiment may include multiple layers. For example, the third insulating layer 143 may include a first sub-insulating layer 143-1 and a second sub-insulating layer 143-2.

The first sub-insulating layer 143-1 and the second sub-insulating layer 143-2 may include different materials. The first sub-insulating layer 143-1 and the second sub-insulating layer 143-2 including different materials may have different etching rates for a same etchant. For example, the material included in the second sub-insulating layer 143-2 may have a higher etching rate than that of a material included in the third conductive layer (161, 162, 163, 164, and 169), and the material included in the third conductive layer (161, 162, 163, 164, and 169) may have a higher etching rate than that of a material included in the first sub-insulating layer 143-1. For example, the first sub-insulating layer 143-1 may include a silicon oxide, the second sub-insulating layer 143-2 includes a silicon nitride, and the third conductive layer (161, 162, 163, 164, and 169) may include titanium (Ti).

A thickness d1 of the first sub-insulating layer 143-1 and a thickness d2 of the second sub-insulating layer 143-2 may be different. The thickness d1 of the first sub-insulating layer 143-1 may range from about 2500 angstroms to about 3500 angstroms, and the thickness d2 of the second sub-insulating layer 143-2 may range from about 900 angstroms to about 1400 angstroms. A sum of the thicknesses of the first sub-insulating layer 143-1 and the second sub-insulating layer 143-2 may be less than or equal to about 5000 angstroms, e.g., less than or equal to about 4000 angstroms. In a case that the sum of the thicknesses of the first sub-insulating layer 143-1 and the second sub-insulating layer 143-2 may exceed about 5000 angstroms, it may be difficult to form a contact hole through which the first insulating layer 141, the second insulating layer 142, and the third insulating layer 143 extend, and the display device may become unnecessarily thick.

The first sub-insulating layer 143-1 may overlap or face a front surface of the substrate 110 except for a region where the contact hole may be formed. The second sub-insulating layer 143-2 may have substantially a same planar shape as the third conductive layer (161, 162, 163, 164, and 169). In other words, the edges of the second sub-insulating layer 143-2 and the third conductive layer (161, 162, 163, 164, and 169) may substantially overlap or face each other. Edges of the second sub-insulating layer 143-2 and the third conductive layer (161, 162, 163, 164, and 169) may substantially overlap or face each other along a thickness direction of the display device. As another example, an edge of the second sub-insulating layer 143-2 and an edge of the third conductive layer (161, 162, 163, 164, and 169) may be substantially parallel in the thickness direction of the display device.

The third insulating layer 143 including the first sub-insulating layer 143-1 and the second sub-insulating layer 143-2 may have different thicknesses at regions thereof. For example, a portion of the third insulating layer 143 overlapping or facing with the third conductive layer (161, 162, 163, 164, and 169) may have a thicker thickness than a remaining portion not overlapping or facing the third conductive layer (161, 162, 163, 164, and 169). For example, the third insulating layer 143 may have different thicknesses at a first region overlapping or facing the third conductive layer (161, 162, 163, 164, and 169) and a second region not overlapping or facing the third conductive layer (161, 162, 163, 164, and 169) as a result of being divided into the first region and the second region.

The third insulating layer 143 may have a contact hole 64 positioned on the extension 157 of the storage line 156. The second and third insulating layers 142 and 143 may have a contact hole 61 positioned on the driving gate electrode 155a. The first to third insulating layers 141, 142, and 143 may have a contact hole 62 positioned on a portion where the second electrode 137c1 of the third transistor first portion T3_1 and the second electrode 137d1 of the fourth transistor first portion T4_1 meet each other, a contact hole 63 positioned on the first electrode 136b of the second transistor T2, a contact hole 65 positioned on the first electrode 136e of the fifth transistor T5, a contact hole 66 positioned on the second electrode 137f of the sixth transistor T6, and a contact hole 67 positioned where the first electrode 136d2 of the fourth transistor second portion T4_2 and the second electrode 137g of the seventh transistor T7 meet each other.

The third conductive layer (161, 162, 163, 164, and 169) including an initialization voltage line 169 and connecting members (161, 162, 163, and 164) may be disposed on the third insulating layer 143.

The third conductive layer (161, 162, 163, 164, and 169) may have at least a dual-layer structure. The third conductive layer (161, 162, 163, 164, and 169) having the dual-layer structure may include different materials. For example, the third conductive layer (161, 162, 163, 164, and 169) may include a lower layer (161-1, 162-1, 163-1, 164-1, and 169-1) containing titanium (Ti) and an upper layer (161-2, 162-2, 163-2, 164-2, and 169-2) containing molybdenum.

The lower layer (161-1, 162-1, 163-1, 164-1, and 169-1) and the upper layer (161-2, 162-2, 163-2, 164-2, and 169-2) included in the third conductive layer (161, 162, 163, 164, and 169) may have different thicknesses. The lower layer (161-1, 162-1, 163-1, 164-1, and 169-1) may be thinner than the upper layer (161-2, 162-2, 163-2, 164-2, and 169-2), and for example, the thickness of the lower layer (161-1, 162-1, 163-1, 164-1, and 169-1) may range from about 300 to about 700 angstroms, and the thickness of the upper layer (161-2, 162-2, 163-2, 164-2, and 169-2) may range from about 2200 angstroms to about 2800 angstroms.

Figure 5:
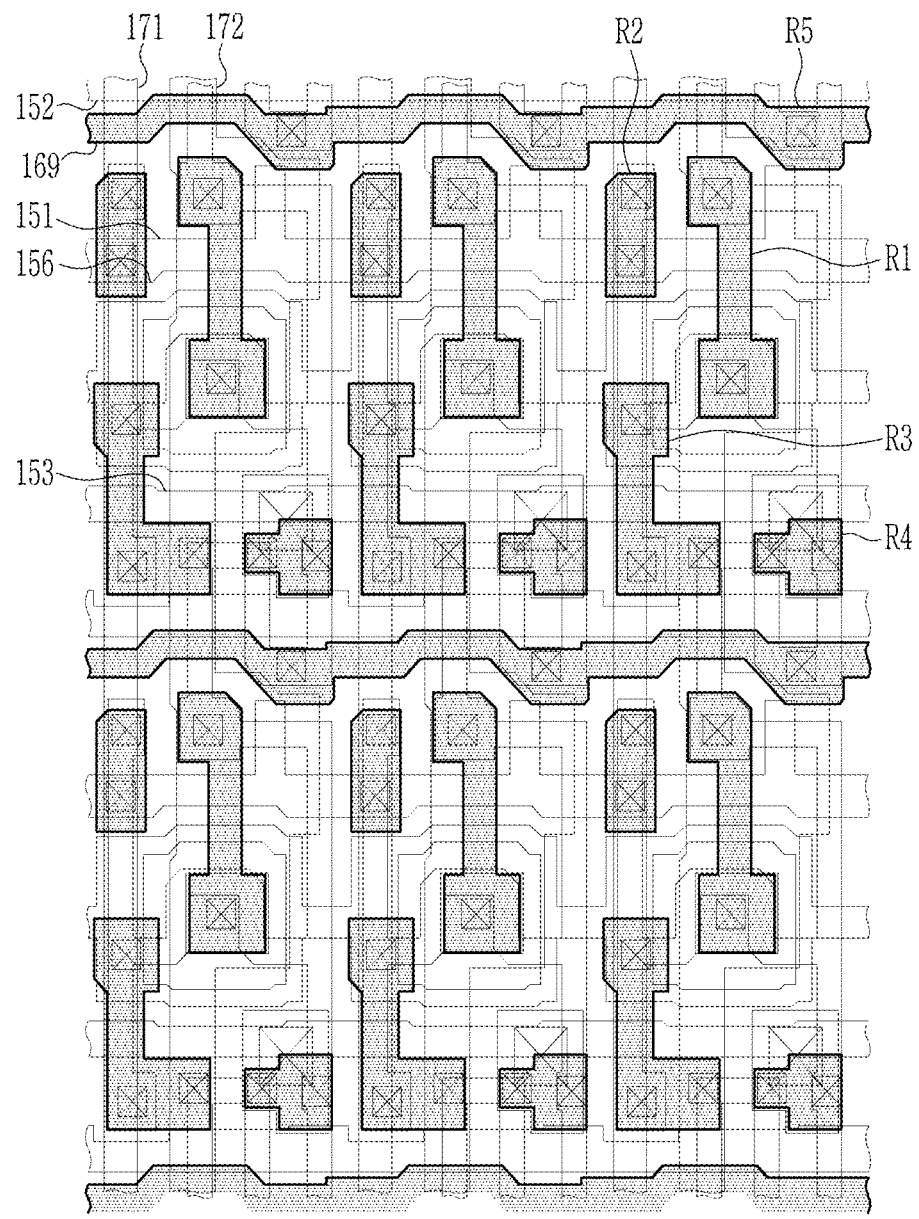
FIG. 5 illustrates a schematic top plan view of pixels in a display device according to an embodiment.

Referring to FIG. 5, the second sub-insulating layer 143-2 may include a first region that overlaps or faces the first connecting member 161 included in the third conductive layer (161, 162, 163, 164, and 169), a second region R2 that overlaps or faces the second connecting member 162 included in the third conductive layer (161, 162, 163, 164, and 169), a third region R3 that overlaps or faces the third connecting member 163 included in the third conductive layer (161, 162, 163, 164, and 169), a fourth region R4 that overlaps or faces the fourth connecting member 164, and a fifth region R5 that overlaps or faces the initialization voltage line 169. Although the embodiment provides that the second sub-insulating layer 143-2 may include the first region R1 to the fifth region R5, the embodiment may not be limited thereto. For example, the embodiment may include multiple regions including a flat surface of substantially a same shape as the third conductive layer (161, 162, 163, 164, and 169).

The first region R1, the second region R2, the third region R3, and the fourth region R4 may be spaced apart from each other in a plan view. Each of the first region R1, the second region R2, the third region R3, and the fourth region R4 may have an island shape. In contrast, as illustrated in FIG. 5, a portion of the fifth region R5 overlapping or facing the initialization voltage line 169 may be connected to another portion of the fifth region R5 positioned in a pixel that is adjacent thereto along the horizontal direction. For example, the fifth region R5 may have a shape extending in the horizontal direction in a plan view.

The second sub-insulating layer 143-2 may be disposed only in a region of one pixel, e.g., in a region overlapping or facing the third conductive layer (161, 162, 163, 164, and 169). Therefore, the third insulating layer 143 may have different thicknesses depending on regions thereof. For example, the third insulating layer 143 overlapping or facing with the third conductive layer (161, 162, 163, 164, and 169) may have a thicker thickness than a remaining portion not overlapping or facing the third conductive layer (161, 162, 163, 164, and 169). In other words, the third insulating layer 143 may have different thicknesses at a first region overlapping or facing the third conductive layer (161, 162, 163, 164, and 169) and a second region not overlapping or facing the third conductive layer (161, 162, 163, 164, and 169) as a result of being divided into the first region and the second region.

According to an embodiment, the third conductive layer (161, 162, 163, 164, and 169) may overlap or face the first sub-insulating layer 143-1 and the second sub-insulating layer 143-2. A region in which the third conductive layer (161, 162, 163, 164, and 169) may not be disposed may overlap or face the first sub-insulating layer 143-1, but may not overlap or face the second sub-insulating layer 143-2.

Figure 3:
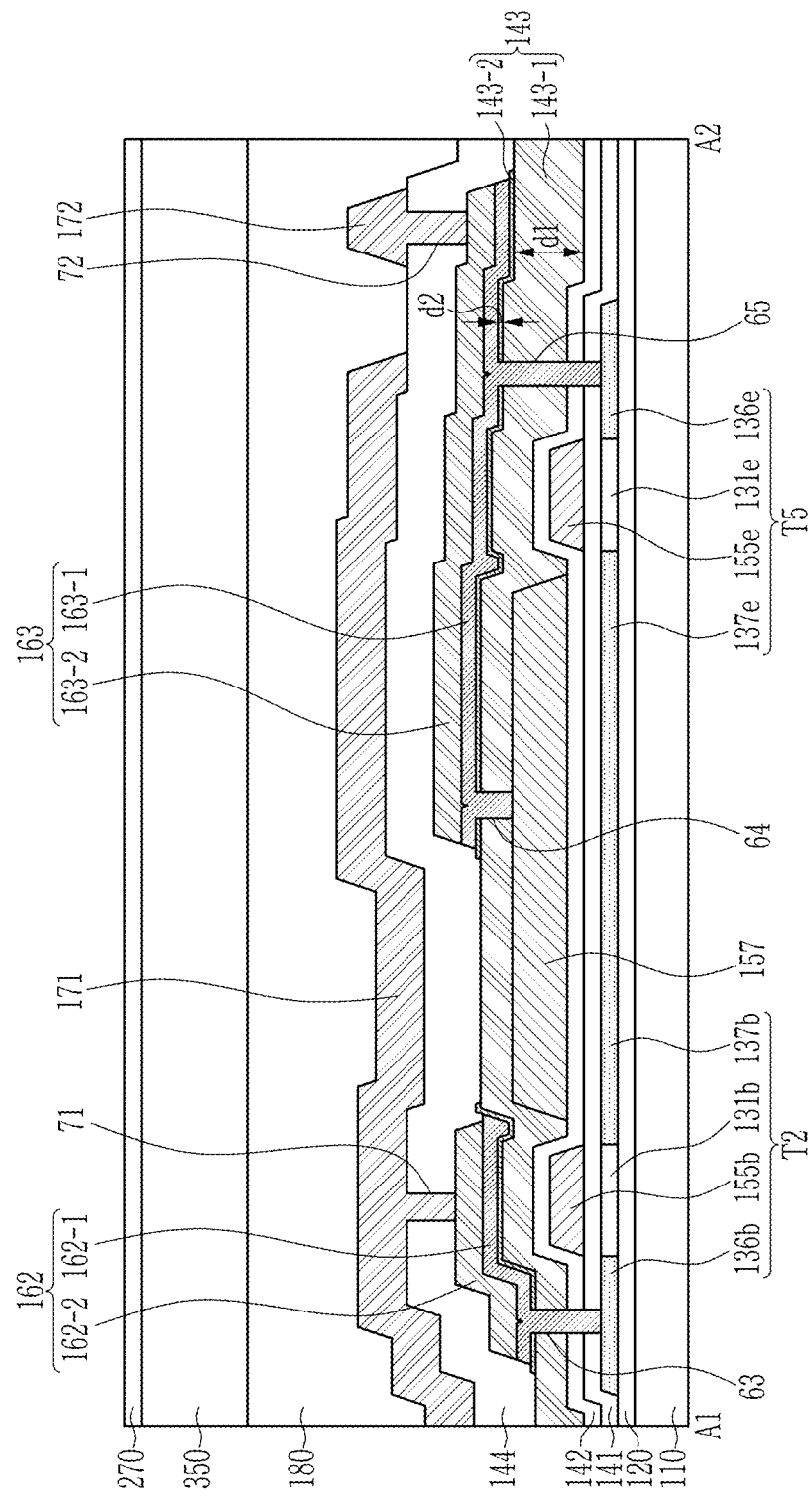
FIG. 3 illustrates a schematic cross-sectional view of the display device taken along a line A1-A2 of FIG. 2.
Figure 4:
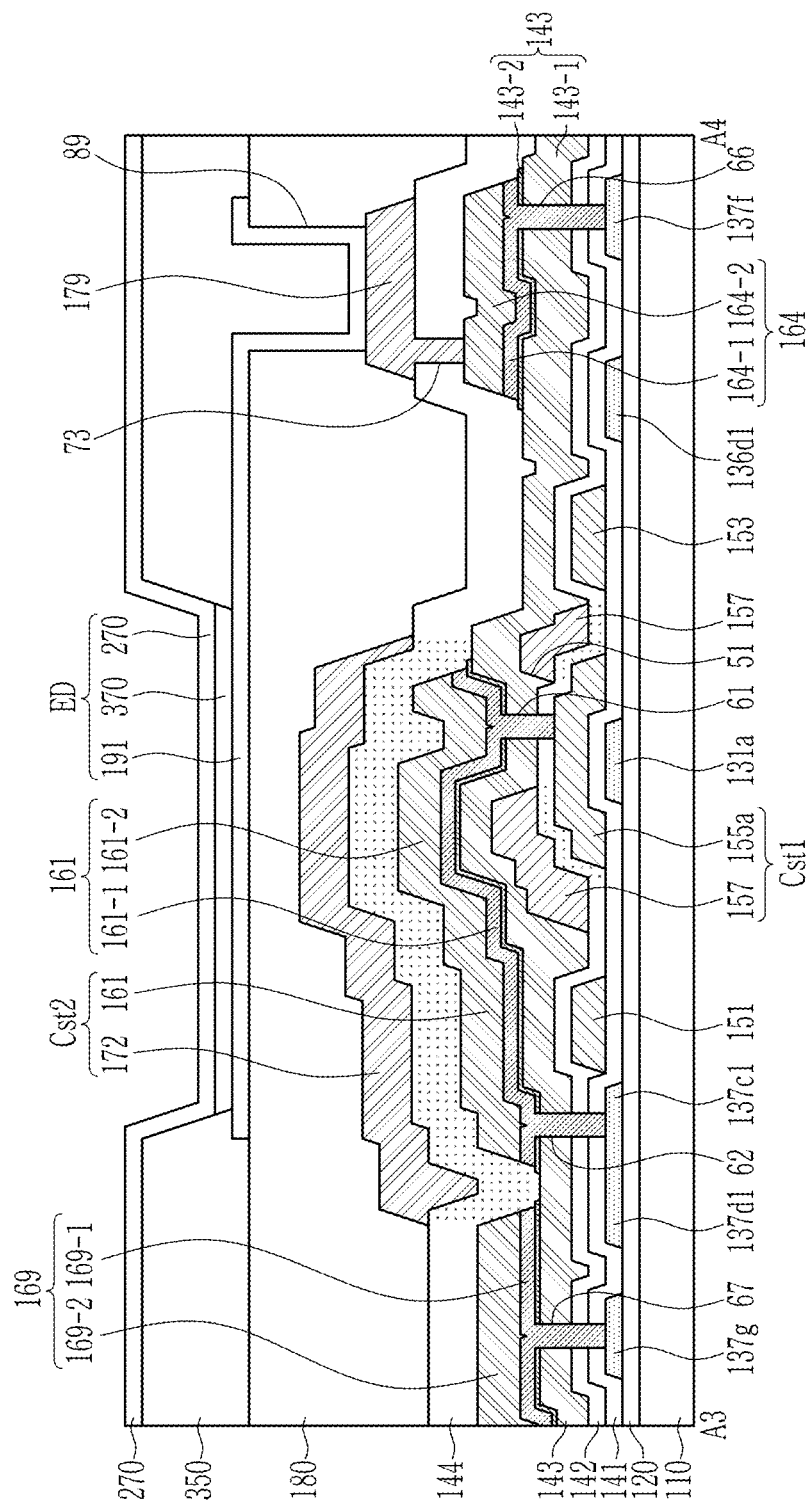
FIG. 4 illustrates a schematic cross-sectional view of the display device taken along a line A3-A4 of FIG. 2.

Referring to FIG. 3 and FIG. 4, an edge of the second sub-insulating layer 143-2 may have a tapered shape. As illustrated, an edge of the second sub-insulating layer 143-2 may protrude beyond an edge of the third conductive layer (161, 162, 163, 164, and 169).

Although it has been described that the first region to the fifth region R1, R2, R3, R4, and R5 have substantially a same, i.e., aligned, edge as that of the third conductive layer (161, 162, 163, 164 and 169), it may be difficult to configure each identically. Thus, a case in which each has a substantially same or aligned edge may include a case that a distance between the edge of the second sub-insulating layer 143-2 and the edge of the third conductive layer (161, 162, 163, 164, and 169) may be less than or equal to about several nanometers to about several tens. In other words, the edge of the second sub-insulating layer 143-2 and the edge of the third conductive layer (161, 162, 163, 164, and 169) may be substantially the same so as to substantially align with each other, even though they may be offset according to the aforementioned amounts.

The initialization voltage line 169 may be electrically connected to the first electrode 136d2 of the fourth transistor second part T4_2 and the second electrode 137g of the seventh transistor T7 through the contact hole 67. The first connecting member 161 may be electrically connected to the driving gate electrode 155a, the second electrode 137c1 of the third transistor first portion T3_1, and the second electrode 137d1 of the fourth transistor first portion T4_1 through the contact holes 61 and 62. The second connecting member 162 may be electrically connected to the first electrode 136b of the second transistor T2 through the contact hole 63. The third connecting member 163 may be electrically connected to the extension 157 of the storage line 156 and the first electrode 136e of the fifth transistor T5 through the contact holes 64 and 65. The fourth connecting member 164 may be electrically connected to the second electrode 137f of the sixth transistor T6 through the contact hole 66.

A fourth insulating layer 144 may be disposed on the third conductive layer (161, 162, 163, 164, and 169) and the third insulating layer 143.

The fourth insulating layer 144 may include the contact hole 71 positioned on the second connecting member 162, the contact hole 72 positioned on the third connecting member 163, and the contact hole 73 positioned on the fourth connecting member 164.

The fourth insulating layer 144 may include an inorganic insulating material such as a silicon nitride or a silicon oxide, and/or may include an organic insulating material. The fourth insulating layer 144 according to an embodiment may directly contact the first sub-insulating layer 143-1 in a region where the second sub-insulating layer 143-2 may not be disposed, i.e., where the third conductive layer (161, 162, 163, 164, and 169) may not be disposed.

A fourth conductive layer (171, 172, and 179) including the data line 171, the driving voltage line 172, the connecting member 179, and the like may be disposed on the fourth insulating layer 144. The data line 171 may be electrically connected to the second connecting member 162 through the contact hole 71. The driving voltage line 172 may be electrically connected to the third connecting member 163 through the contact hole 72. The connecting member 179 may be electrically connected to the fourth connecting member 164 through the contact hole 73.

The driving voltage line 172 (including the extension 178) may overlap or face the first connecting member 161 with the fourth insulating layer 144 therebetween to form a second sub-capacitor Cst2.

At least one of the first conductive layer (151, 152, 153, 154, and 155a), the second conductive layer (156 and 157), and the fourth conductive layer (171, 172, and 179) may include a conductive material such as copper (Cu), aluminum (Al), molybdenum (Mo), titanium (Ti), tantalum (Ta), or an alloy of at least two metals thereof.

A passivation layer 180 may be disposed on the fourth conductive layer 171, 172, and 179 and the fourth insulating layer 144. The passivation layer 180 may include an organic insulating material such as a polyacrylic-based resin or a polyimide-based resin. A top surface of the passivation layer 180 may be substantially planarized. The passivation layer 180 may include a contact hole 89 disposed on the connecting member 179.

A fifth conductive layer 191 including pixel electrodes 191 may be disposed on the passivation layer 180. Each of the pixel electrodes 191 may be connected with the connecting member 179 through the contact hole 89 to receive a voltage. The pixel electrodes 191 may be arranged in a PENTILE® matrix structure.

The partition wall 350 may be disposed on the passivation layer 180 and the pixel electrodes 191. The partition wall 350 may have an opening positioned on each of the pixel electrodes 191.

An emission layer 370 may be disposed on the pixel electrodes 191. The emission layer 370 may be positioned in the openings of the partition wall 350. The emission layer 370 may include an organic emission material or an inorganic emission material.

A common electrode 270 may be disposed on the emission layer 370. The common electrode 270 may also be disposed on the partition wall 350 to extend over multiple pixels.

The pixel electrode 191, the emission layer 370, and the common electrode 270 constitute a light emitting diode ED.

A sealing layer (not illustrated) may be further disposed on the common electrode 270 to protect the light emitting diode ED. The sealing layer may include an inorganic film and an organic film that may be alternately stacked, or may include only an inorganic film or only an organic film.

Figure 6:
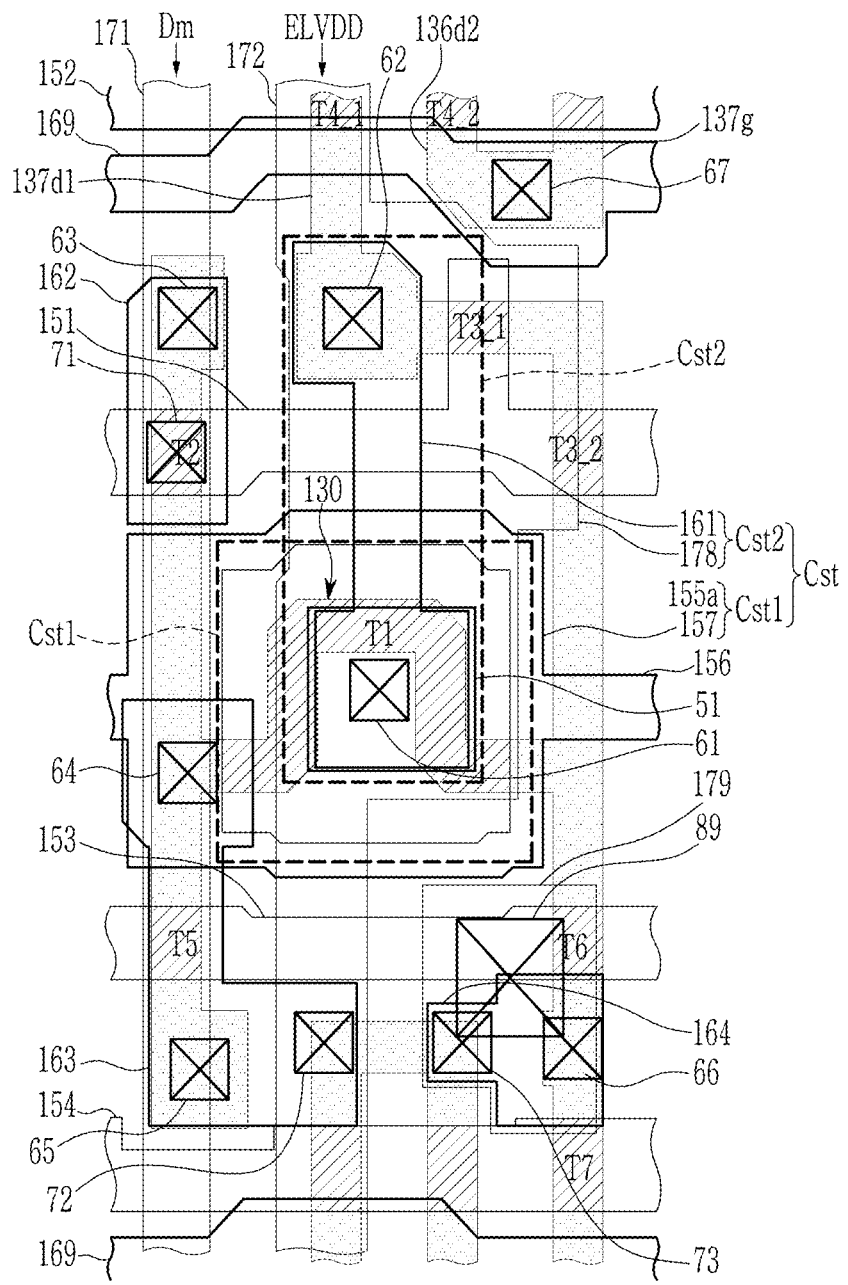
FIG. 6 illustrates a layout view of a pixel of a display device according to an embodiment.

Referring to FIG. 6, the first connecting member 161 may include a portion overlapping or facing the driving gate electrode 155a in a plan view so as to be connected to the driving gate electrode 155a through the contact hole 61. A planar region (indicated by a dotted line) of the first sub-capacitor Cst1 and a planar region (indicated by a dotted line) of second sub-capacitor Cst may at least partially overlap or face each other. For example, a lower portion of the planar region of the second sub-capacitor Cst2 may overlap or face the planar region of the first sub-capacitor Cst1, and the planar region of the second sub-capacitor Cst2 may have a shape extending in an upward direction from the overlapping or facing region.

Figure 7:
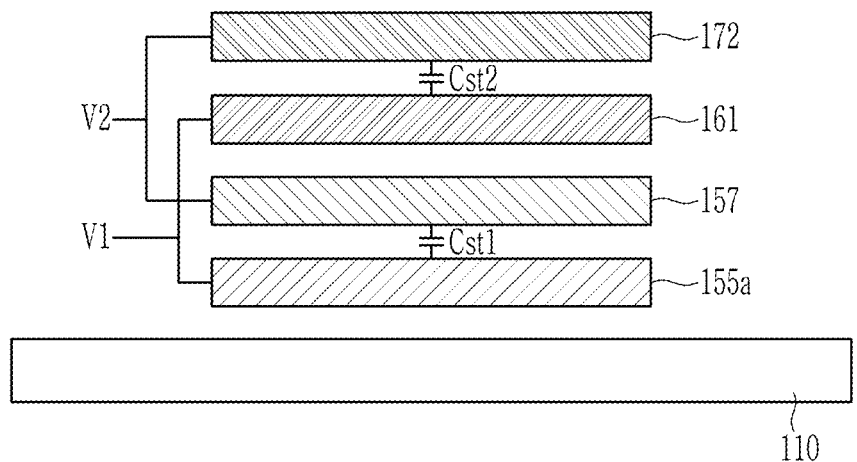
FIG. 7 illustrates a schematic cross-sectional view showing conductors constituting a capacitor of a display device according to an embodiment.

FIG. 7 illustrates a schematic cross-sectional disposal of conductors constituting terminals of the first sub-capacitor Cst1 and the second sub-capacitor Cst2 on the substrate 110. Referring to FIG. 7, the first connecting member 161 which may be electrically connected to the driving gate electrode 155a may receive a same voltage V1 as the driving gate electrode 155a. The extension 157 of the storage line 156 which may be electrically connected to the driving voltage line 172 may receive a same voltage V2 as the driving voltage line 172.

When viewed in cross-section, the driving gate electrode 155a, the extension 157 of the storage line 156, the first connecting member 161, and the driving voltage line 172 may be sequentially disposed on the substrate 110. The driving gate electrode 155a and the extension 157 of the storage line 156, which may be adjacent to each other with an insulating layer therebetween, may constitute the first sub-capacitor Cst1. The first connecting member 161 and the driving voltage line 172, which may be adjacent to each other with an insulating layer therebetween, may constitute the second sub-capacitor Cst2. Thus, four conductors forming the terminals of the first sub-capacitor Cst1 and the second sub-capacitor Cst2 may be alternately disposed. Accordingly, the first and second sub-capacitors Cst1 and Cst2 may be efficiently formed in a limited planar space.

The first connecting member 161 may further constitute an additional sub-capacitor (not illustrated) by overlapping or facing the extension 157 of the adjacent storage line 156 with an insulating layer interposed therebetween. Considering the additional sub-capacitor, the capacitor Cst according to the embodiment may be regarded as including at least three sub-capacitors connected in parallel with each other.

Accordingly, at least two sub-capacitors Cst1 and Cst2 connected in parallel may be formed using four conductors disposed in different conductive layers even in a limited planar space, thereby increasing the capacity of the capacitor Cst by more than two times. As illustrated in FIG. 6, at least two sub-capacitors Cst1 and Cst2 may overlap or face each other at least partially in a plan view, thereby maximizing the efficiency with which space within the display device may be used. Therefore, a display device having high resolution may be provided and a capacitor Cst having sufficient capacity may be delivered, thereby preventing the occurrence of image quality defects such as color deviation and crosstalk.

In another example, it may be that only one of the first and second sub-capacitors Cst1 and Cst2 may be selected depending on a design necessity, thereby further increasing a degree of freedom in designing the display device.

A discussion of the active layer 130 of the display device according to an follows below with reference to FIG. 8.

Figure 8:
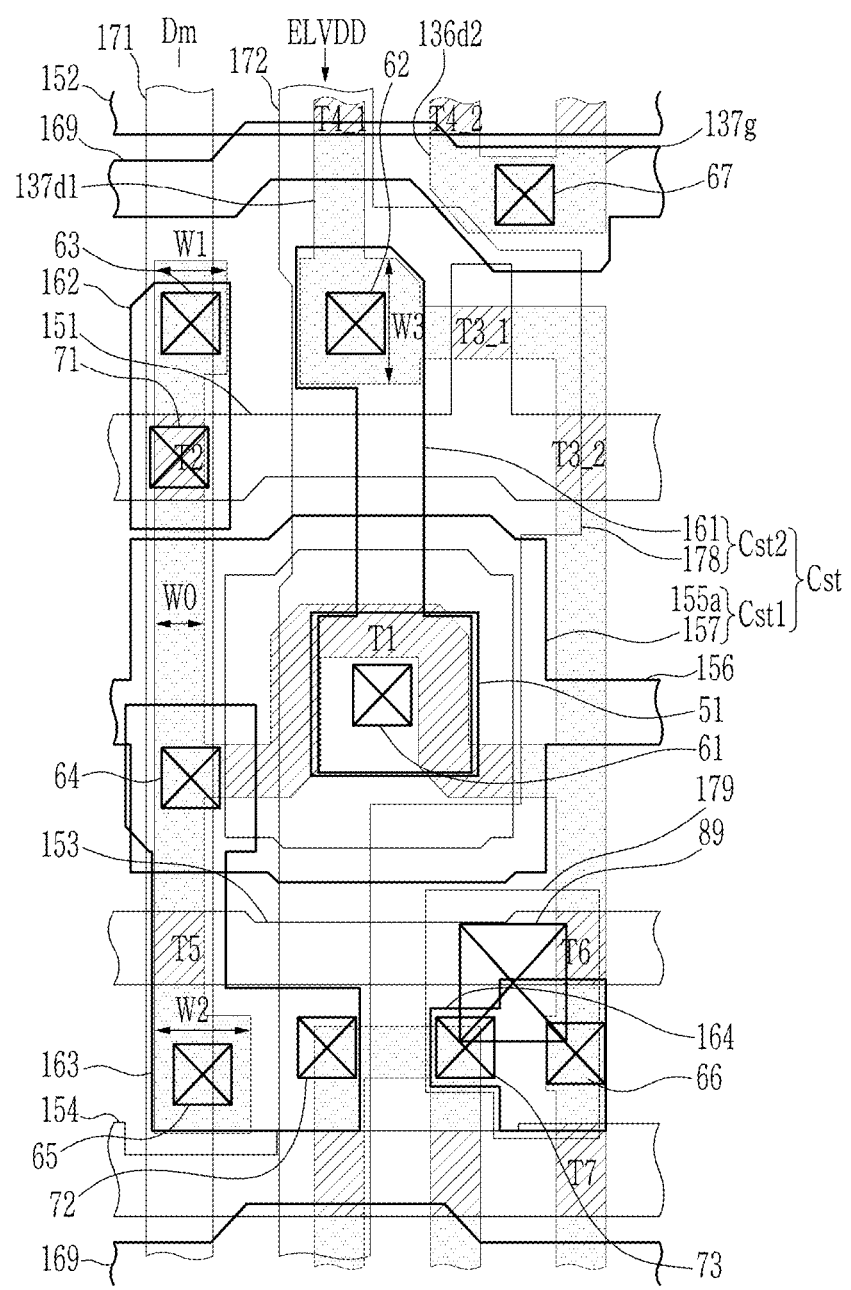
FIG. 8 illustrates a layout view of a pixel of a display device according to an embodiment.

Referring to FIG. 8, a width WO of a continuous portion of the active layer 130 may be substantially constant. However, a planar width of the active layer 130 may be increased where the active layer 130 may overlap or face the contact holes 62, 63, 65, 66, and 67 for electrically connecting constituent elements of another layer. For example, a first width W1 (which may be a horizontal width) of an end portion of the first electrode 136b of the second transistor T2 overlapping or facing the contact hole 63 in the active layer 130 may be larger than that of a portion of the active layer 130 positioned therearound. Similarly, a second width W2 (which may be a horizontal width) of an end portion of the first electrode 136e of the fifth transistor T5 overlapping or facing the contact hole 65 in the active layer 130 may also be larger than that of a portion of the active layer 130 positioned therearound. The second width W2 may be larger than the first width W1, and thus a margin of a space where the contact hole 65 may overlap or face the active layer 130 may be greater. According to the embodiment, and as illustrated in FIG. 8, the second width W2 of a portion of the active layer 130 overlapping or facing the contact hole 65 may be expanded beyond other portions where the third conductive layer (161, 162, 163, 164, and 169) and the fourth conductive layer (171, 172, and 179) that transfer different voltages have a high risk of short circuiting, thereby reducing the risk of a short circuit.

The first connecting member 161 and the driving voltage line 172 may overlap or face each other on a portion of the active layer 130 overlapping or facing the contact hole 62, and because the first connecting member 161 and the driving voltage line 172 transfer different voltages, a short circuit should not occur. Accordingly, the risk of a short circuit may be reduced by increasing a third width W3 of a portion where the active layer 130 overlaps or faces the contact hole 62, i.e., where the second electrode 137c1 of the first transistor T3_1, and the second electrode 137d1 of the fourth transistor T4_1 meet (which may be illustrated as a vertical width for convenience, but may also be a horizontal width), to be larger than the first width W1 in order to secure a process margin such that the contact hole 62 does not escape the active layer 130 when the contact hole 62 may be formed.

A discussion of a cross-section of a region of a display device according to an embodiment follows below with reference to FIG. 9.

Figure 9:
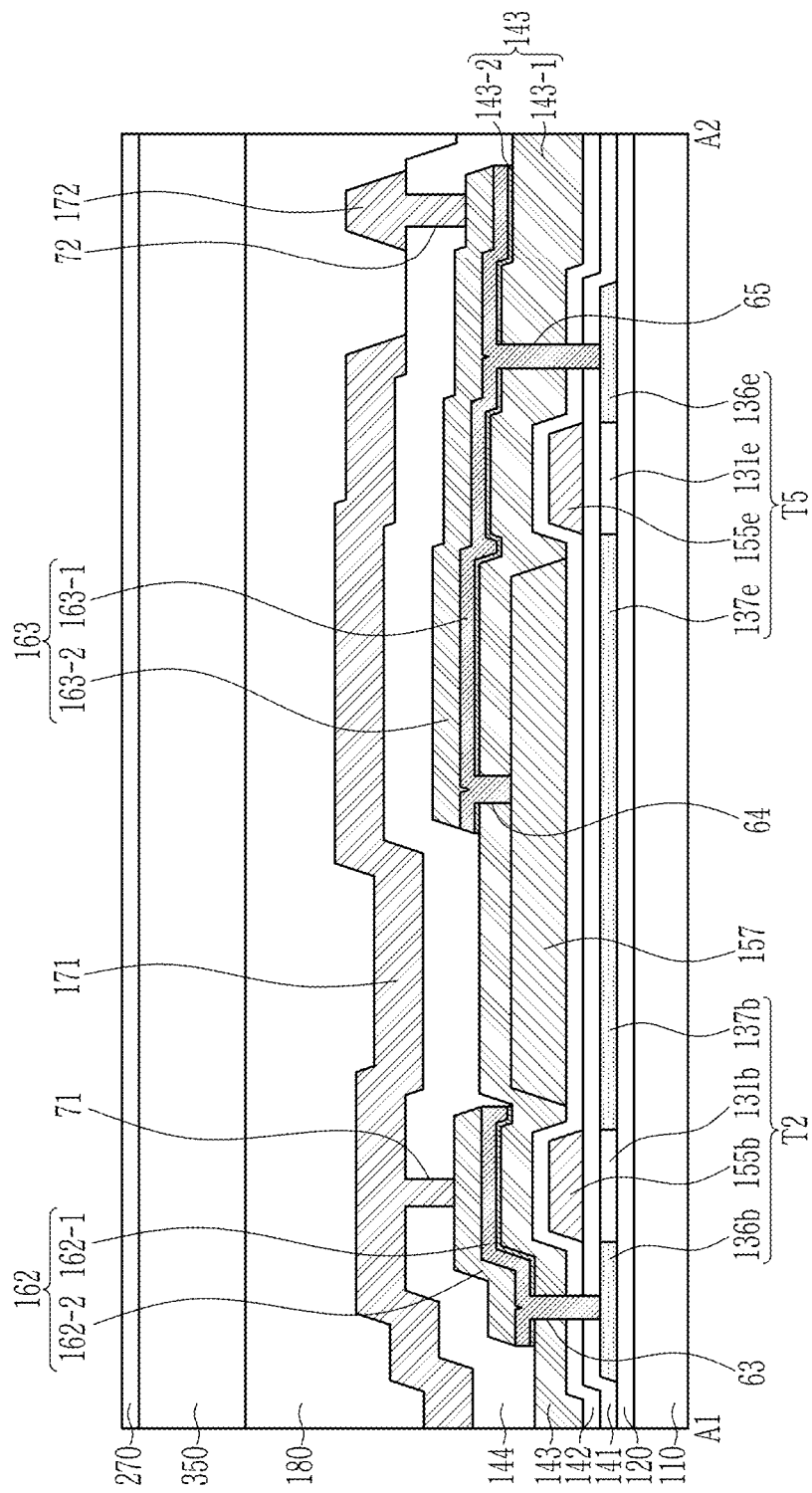
FIG. 9 illustrates a schematic cross-sectional view of a region of a display device according to an embodiment.

Referring to FIG. 9, an end of the second sub-insulating layer 143-2 may be aligned with an edge of the third conductive layer (161, 162, 163, 164, and 169). The edge of the second sub-insulating layer 143-2 may substantially align within a same plane as the edge of the third conductive layer (161, 162, 163, 164, and 169) depending on a process margin. Planar shapes of the second sub-insulating layer 143-2 and the third conductive layer (161, 162, 163, 164, and 169) may be substantially the same. In other words, the edges of the second sub-insulating layer 143-2 and the third conductive layer (161, 162, 163, 164, and 169) may be substantially parallel with each other to overlap or face each other along the thickness direction of the display device.

A discussion of a manufacturing method of a display device according to an embodiment follows below with reference to FIG. 10 to FIG. 30, together with FIG. 1 to FIG. 4.

Figure 10:
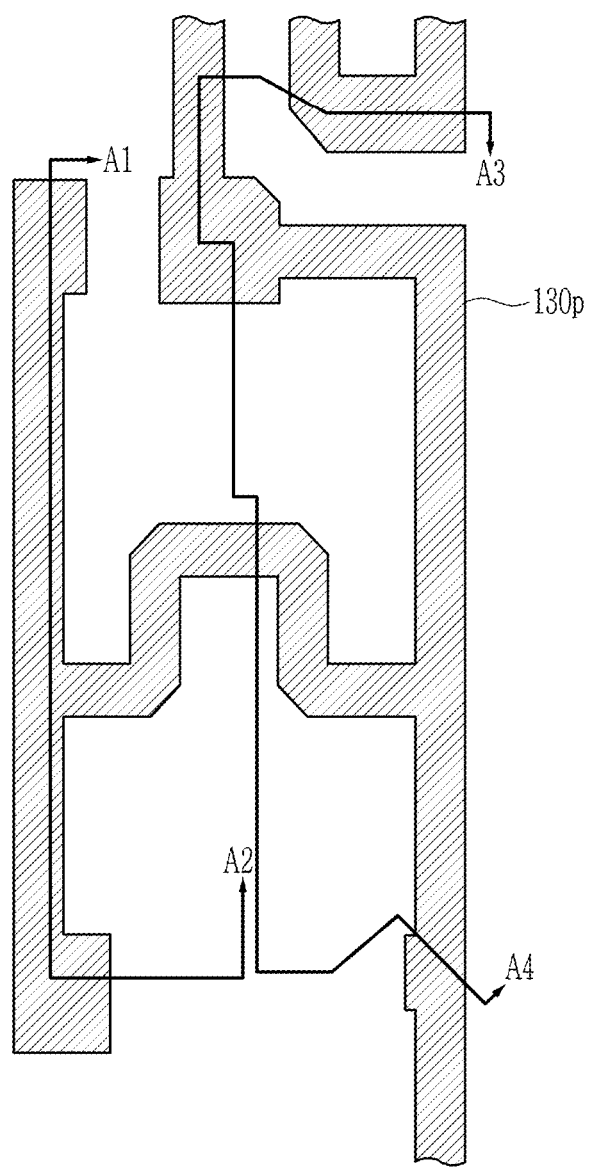
FIG. 10, FIG. 13, FIG. 16, FIG. 19, FIG. 22, FIG. 25, and FIG. 28 illustrate layout views of a pixel of a display device in intermediate process steps of a manufacturing method of the display device according to an embodiment.
Figure 11:
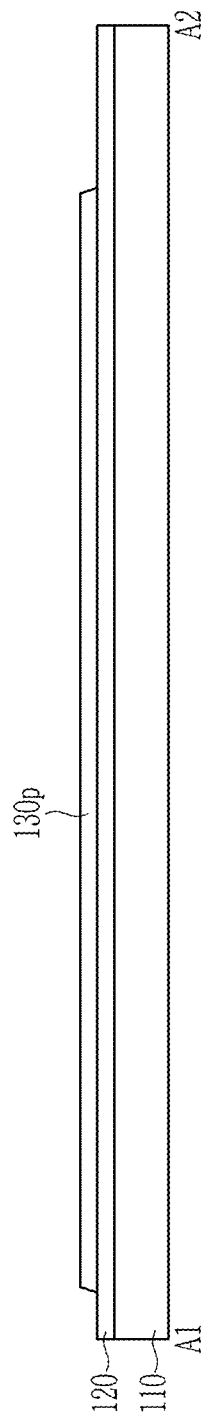
FIG. 11, FIG. 14, FIG. 17, FIG. 20, FIG. 23, FIG. 26, and FIG. 29 respectively illustrate schematic cross-sectional views of the display device taken along a line A1-A2 of FIG. 10, FIG. 13, FIG. 16, FIG. 19, FIG. 22, FIG. 25, and FIG. 28.
Figure 12:
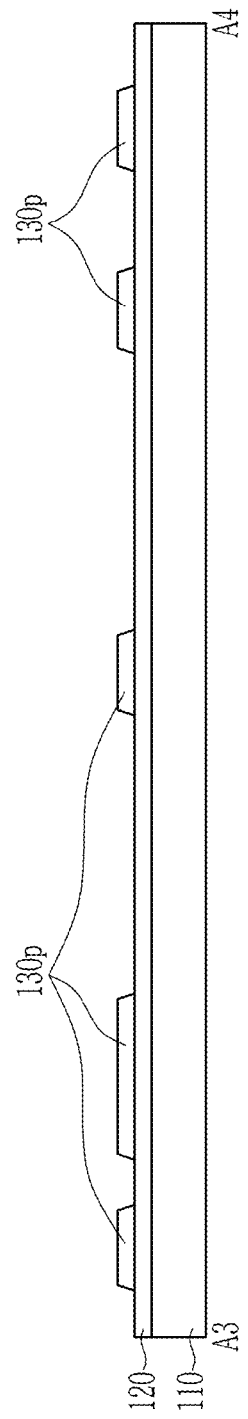
FIG. 12, FIG. 15, FIG. 18, FIG. 21, FIG. 24, FIG. 27, and FIG. 30 respectively illustrate schematic cross-sectional views of the display device taken along a line A3-A4 of FIG. 10, FIG. 13, FIG. 16, FIG. 19, FIG. 22, FIG. 25, and FIG. 28.

Referring to FIG. 10 to FIG. 12, an inorganic insulating material and/or an organic insulating material may be stacked on the substrate 110 to form the buffer layer 120. A semiconductor pattern 130*p* may be formed by stacking and patterning a semiconductor material such as amorphous silicon, polycrystalline silicon, an oxide semiconductor, and the like on the buffer layer 120. This patterning process may include a photolithography process in which a mask pattern may be formed and then etched through an exposure and development process using a photomask, or various processes known to those skilled in the art. An overall planar shape of the semiconductor pattern 130*p* may be the same as the planar shape of the active layer 130 described above.

Figure 13:
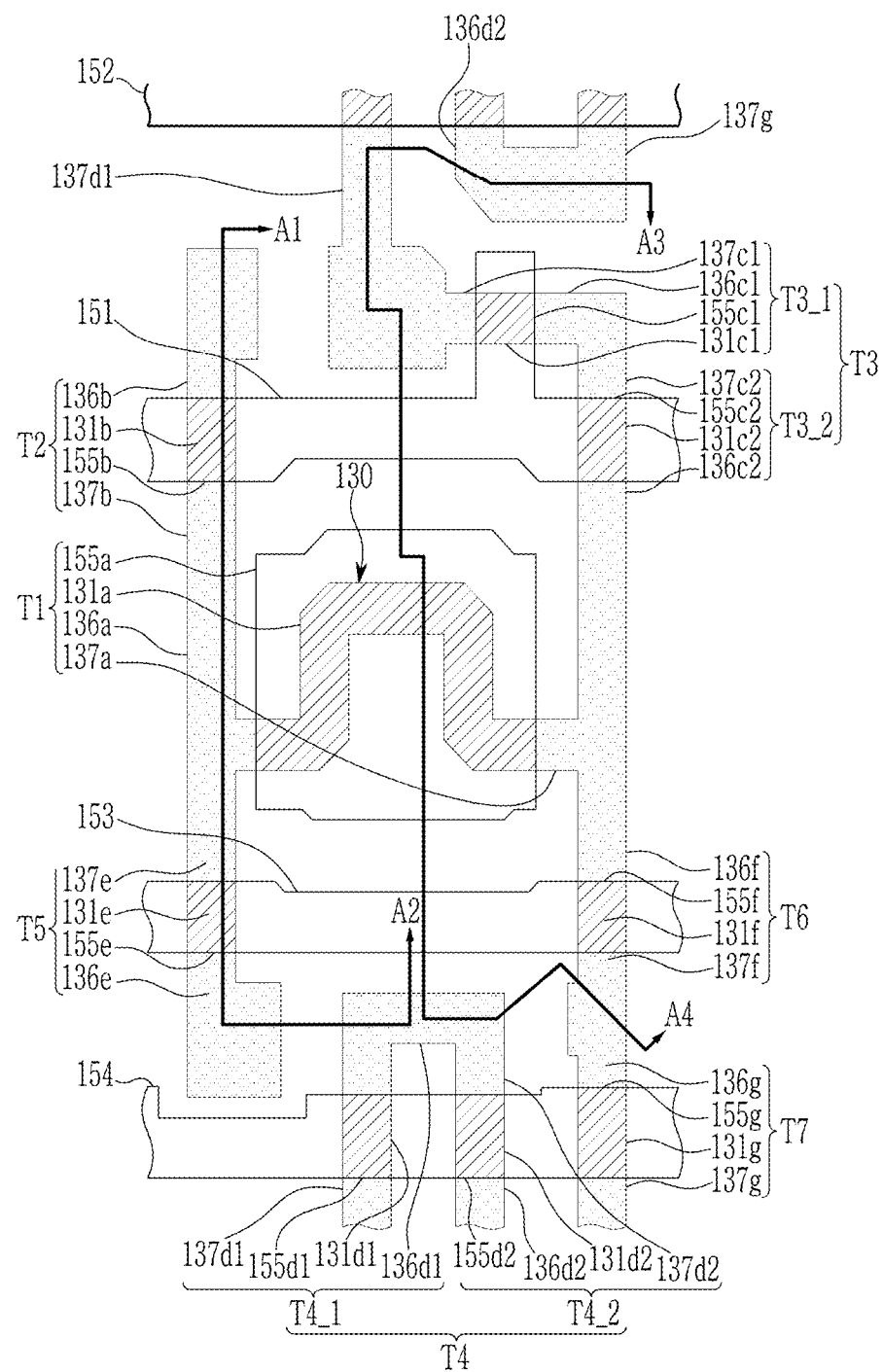
Figure 14:
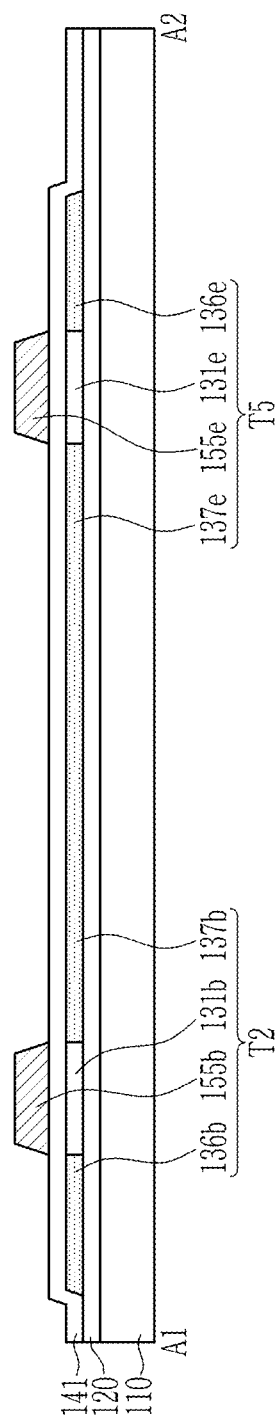
Figure 15:
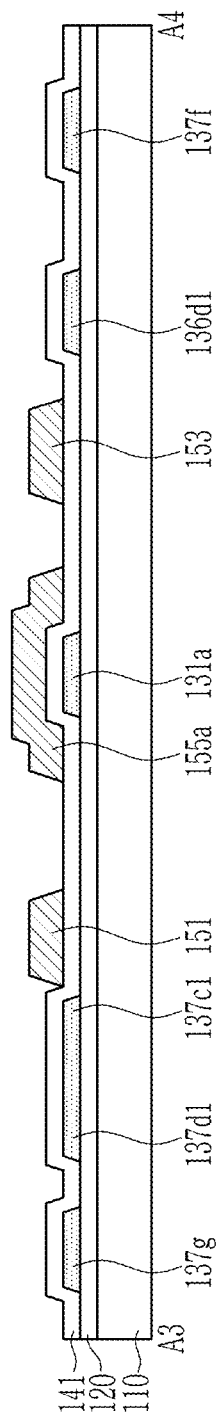

Referring to FIG. 13 to FIG. 15, an inorganic insulating material such as a silicon nitride and a silicon oxide and/or an organic insulating material may be stacked on the semiconductor pattern 130*p* illustrated in FIG. 10 to FIG. 12 to form the first insulating layer 141. A conductive material such as copper (Cu), aluminum (Al), molybdenum (Mo), titanium (Ti), tantalum (Ta), or an alloy of at least two thereof may be stacked on the first insulating layer 141 and may be patterned to form the first conductive layer (151, 152, 153, 154, and 155*a*) including the scan lines 151, 152, and 154, the control line 153, and the driving gate electrode 155*a*

The first conductive layer (151, 152, 153, 154, and 155*a*) may include the gate electrodes 155*a*, 155*b*, 155*c*1, 155*c*2, 155*d*1, 155*d*2, 155*e*, 155*f*, and 155*g* of the aforementioned first to seventh transistors T1, T2, T3, T4, T5, T6, and T7.

The active layer 130 including the channel regions 131*a*, 131*b*, 131*c*1, 131*c*2, 131*d*1, 131*d*2, 131*e*, 131*f*, and 131*g* and the conductive regions 136*a*, 136*b*, 136*c*1, 136*c*2, 136*d*1, 136*d*2, 136*e*, 136*f*, 136*g*, 137*a*, 137*b*, 137*c*1, 137*c*2, 137*d*1, 137*d*2, 137*e*, 137*f*, and 137*g* may be completed by doping the aforementioned semiconductor pattern with N-type or P-type impurities using the first conductive layer (151, 152, 153, 154, and 155*a*) as a mask. Accordingly, the transistors T1, T2, T3, T4, T5, T6, and T7 as described above may be formed.

Figure 16:
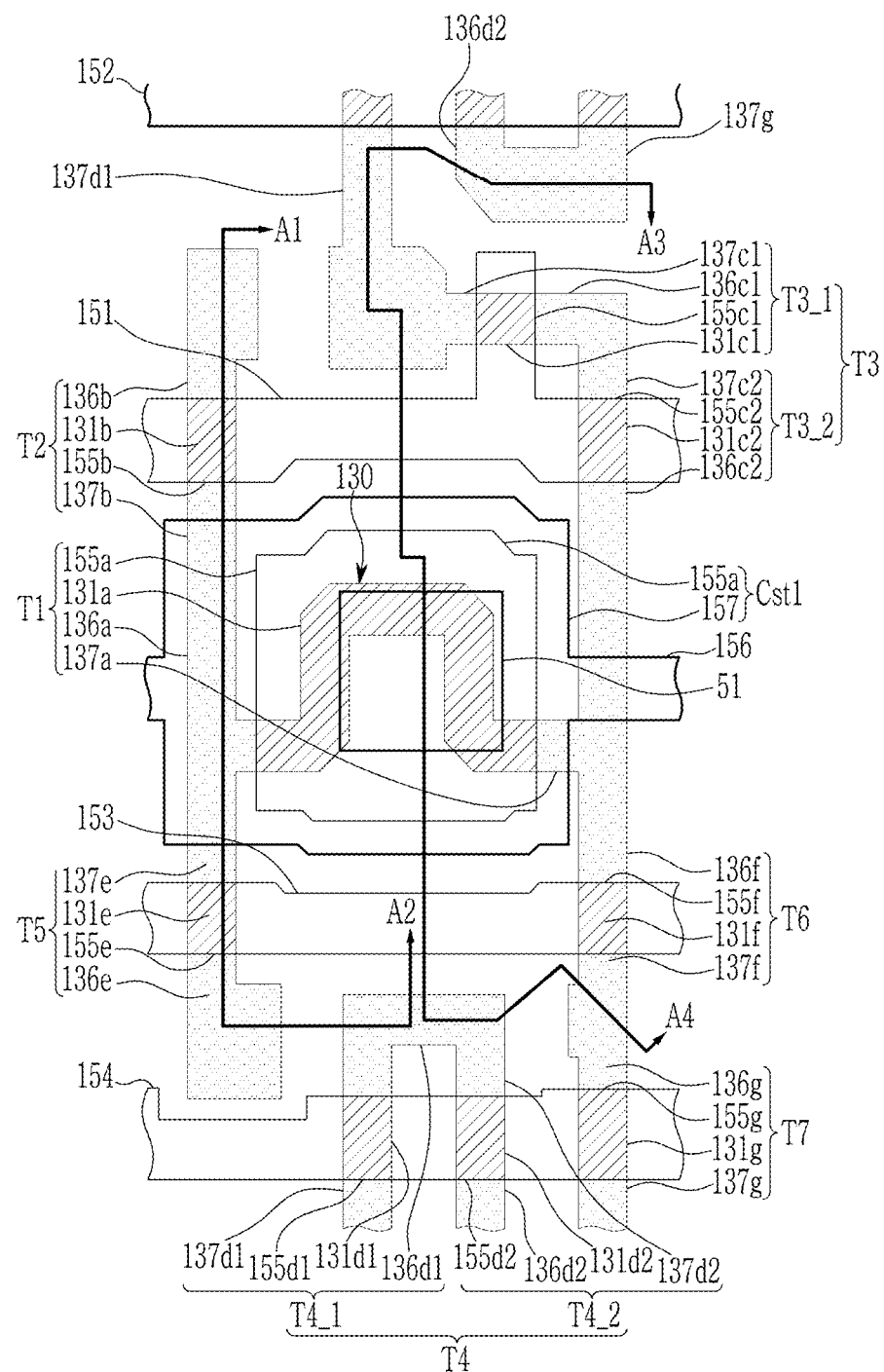
Figure 17:
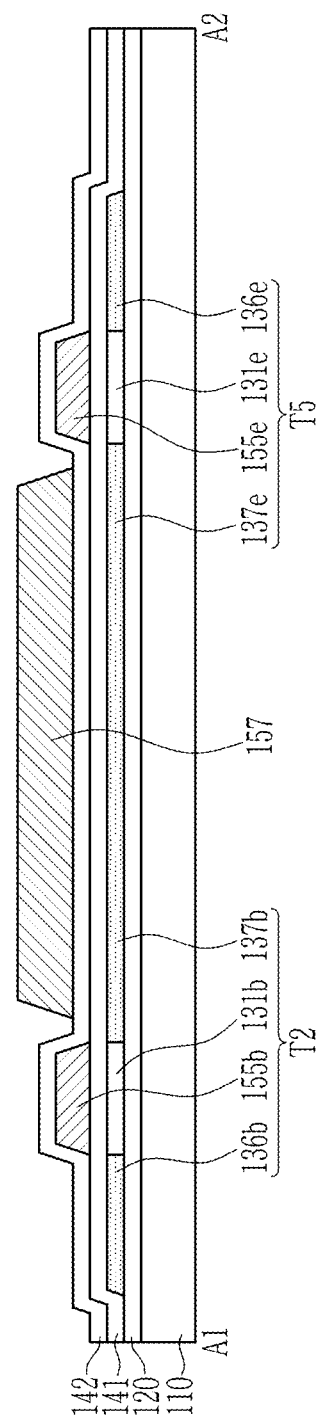
Figure 18:
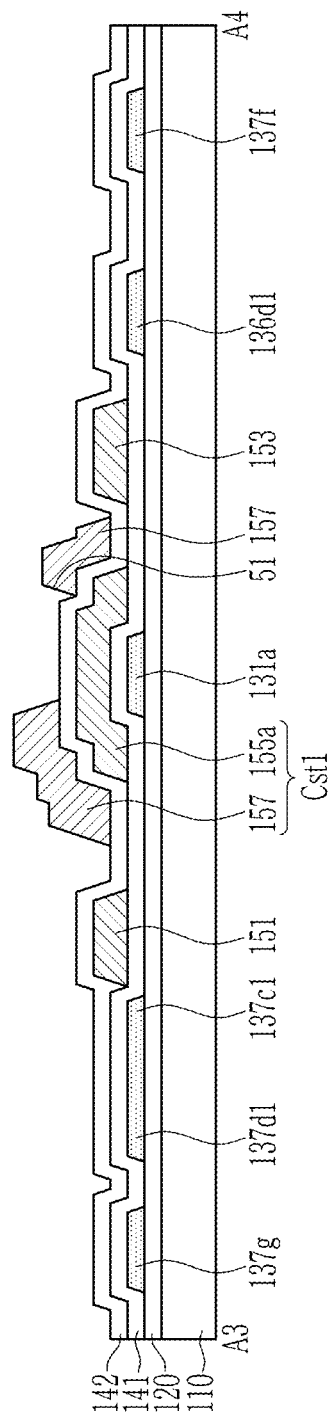

Referring to FIG. 16 to FIG. 18, the second insulating layer 142 may be formed by stacking an inorganic insulating material such as a silicon nitride and a silicon oxide and/or an organic insulating material on the first insulating layer 141 and the first conductive layer (151, 152, 153, 154, and 155*a*). A conductive material such as copper (Cu), aluminum (Al), molybdenum (Mo), titanium (Ti), tantalum (Ta), or an alloy of at least two thereof may be stacked on the second insulating layer 142 and may be patterned to form the second conductive layer (156 and 157) including the storage line 156 including the expansion portion 157 and the opening 51.

Figure 19:
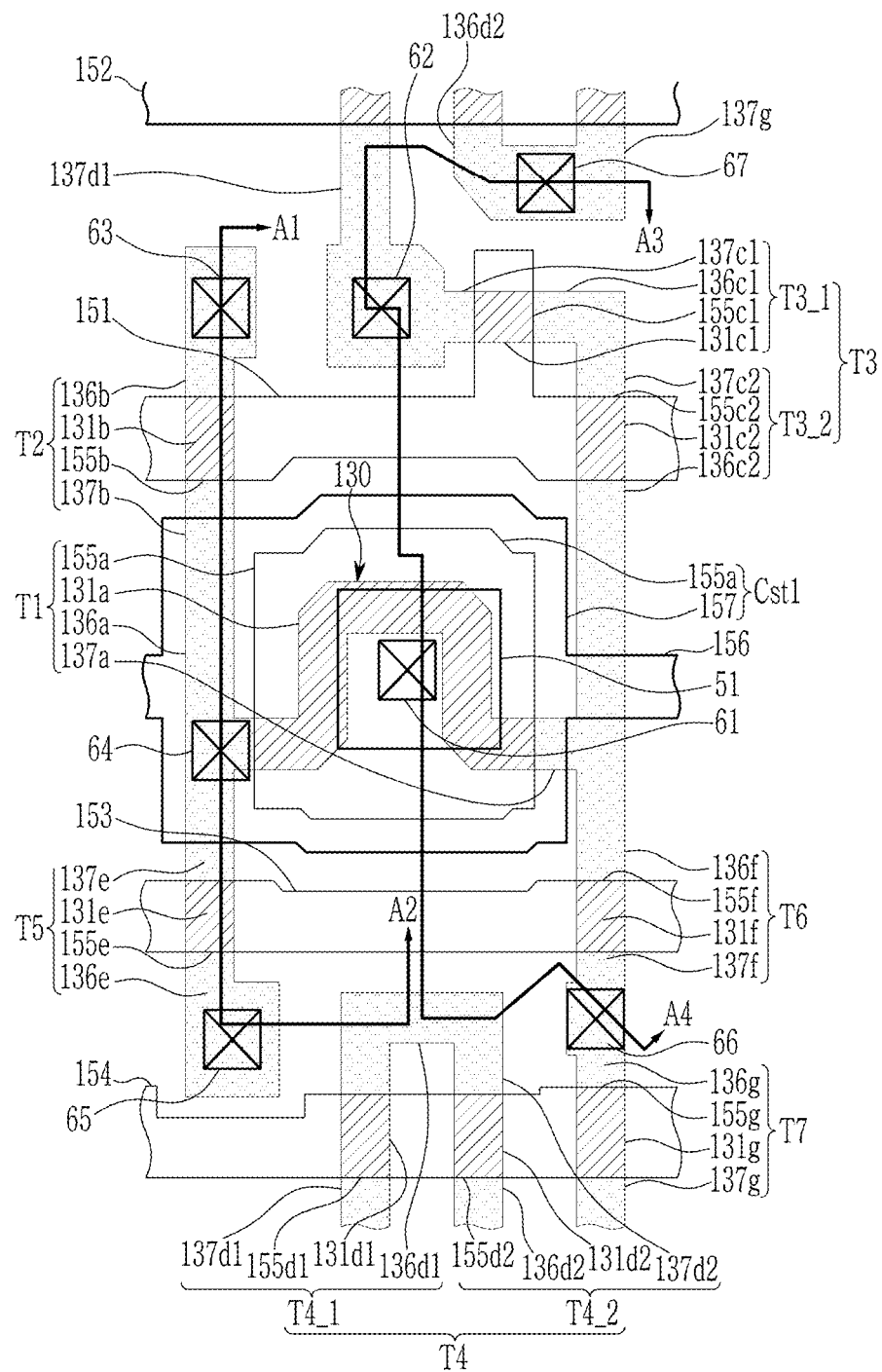
Figure 20:
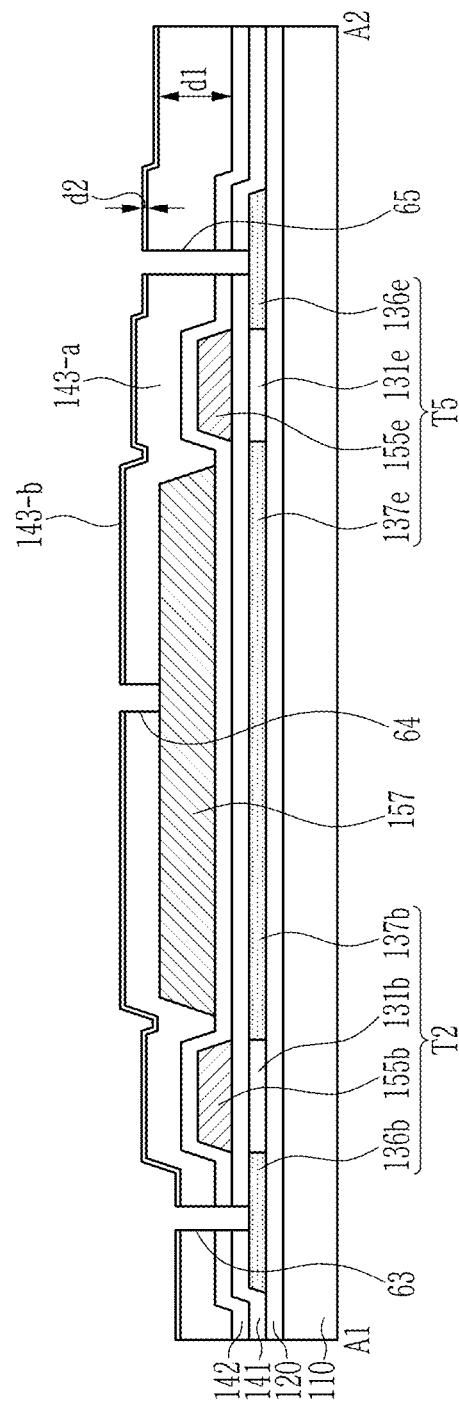
Figure 21:
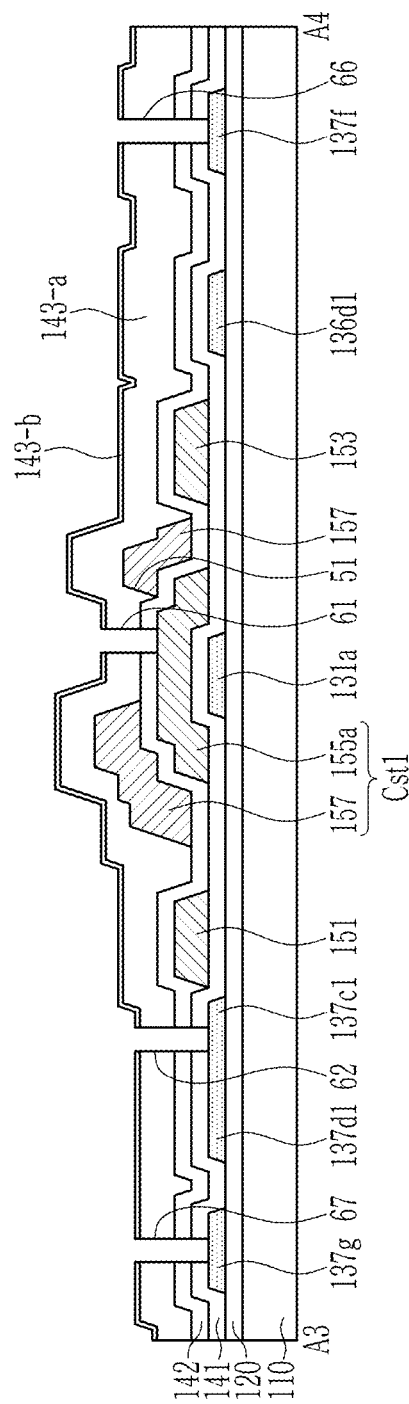

Referring to FIG. 19 to FIG. 21, an inorganic insulating material such as a silicon nitride and a silicon oxide and/or an organic insulating material may be stacked on the second insulating layer 142 and the second conductive layer (156 and 157) to form a first sub-insulating material layer 143-*a* and a second sub-insulating material layer 143-*b*.

The first insulating layer 141, the second insulating layer 142, the first sub-insulating material layer 143-*a*, and the second sub-insulating material layer 143-*b* may be patterned by a photolithography process or the like, to have the contact holes 61, 62, 63, 64, 65, 66, and 67 through some or all of the first insulating layer 141, the second insulating layer 142, the first sub-insulating material layer 143-*a*, and the second sub-insulating material layer 143-*b*. As described above, since the active layer 130 provided in a portion where the contact holes 62 and 65 are positioned may be sufficiently extended, the contact holes 62 and 65 may have sufficient process margins so as to be formed only on the active layer 130.

Figure 22:
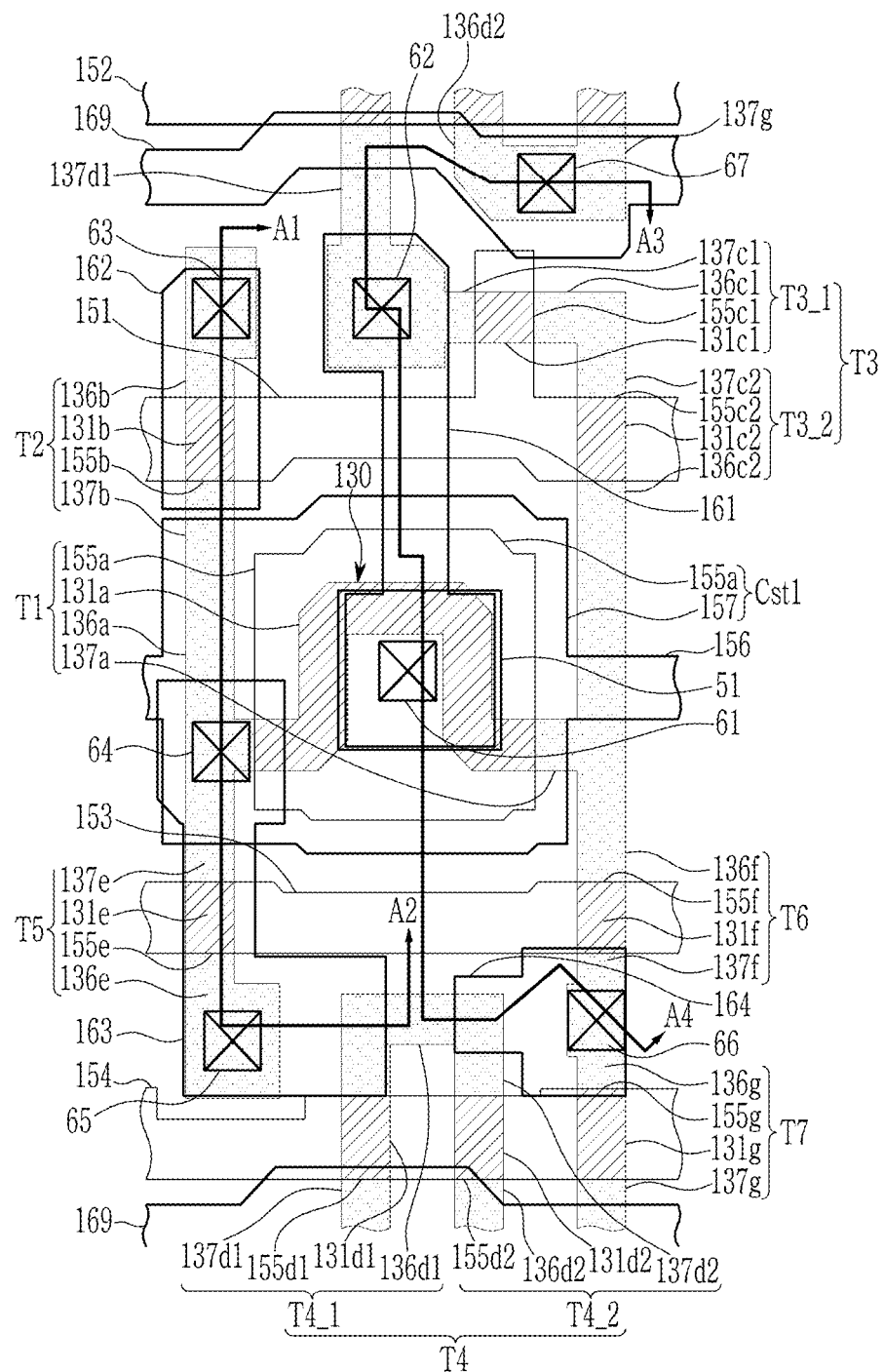
Figure 23:
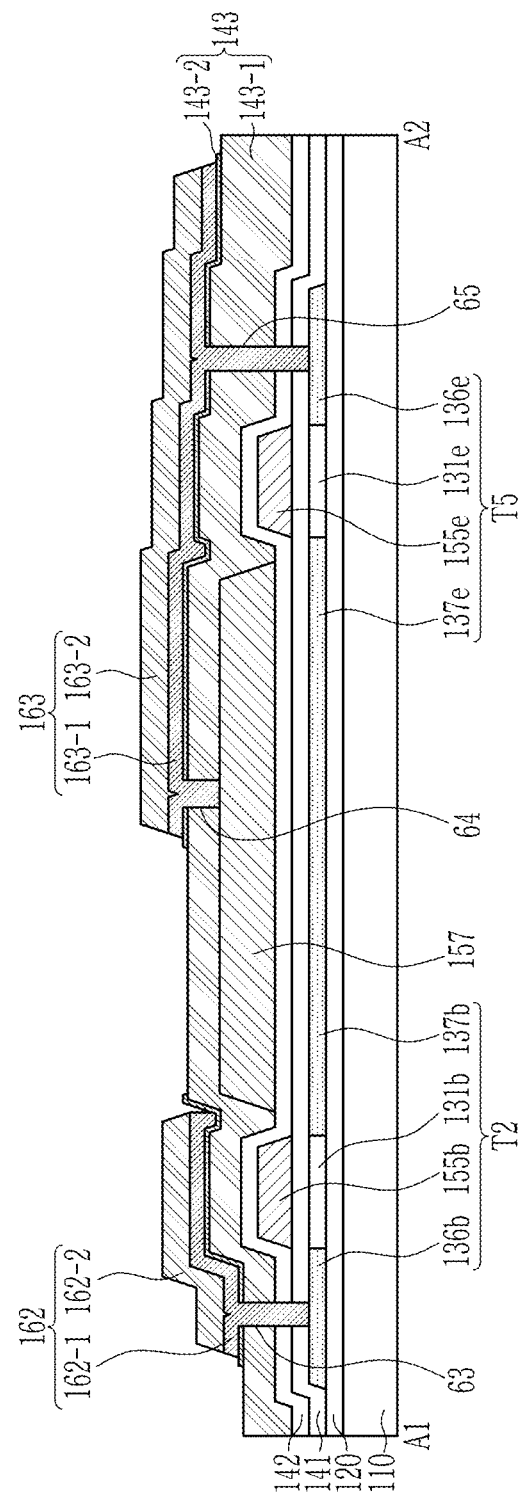
Figure 24:
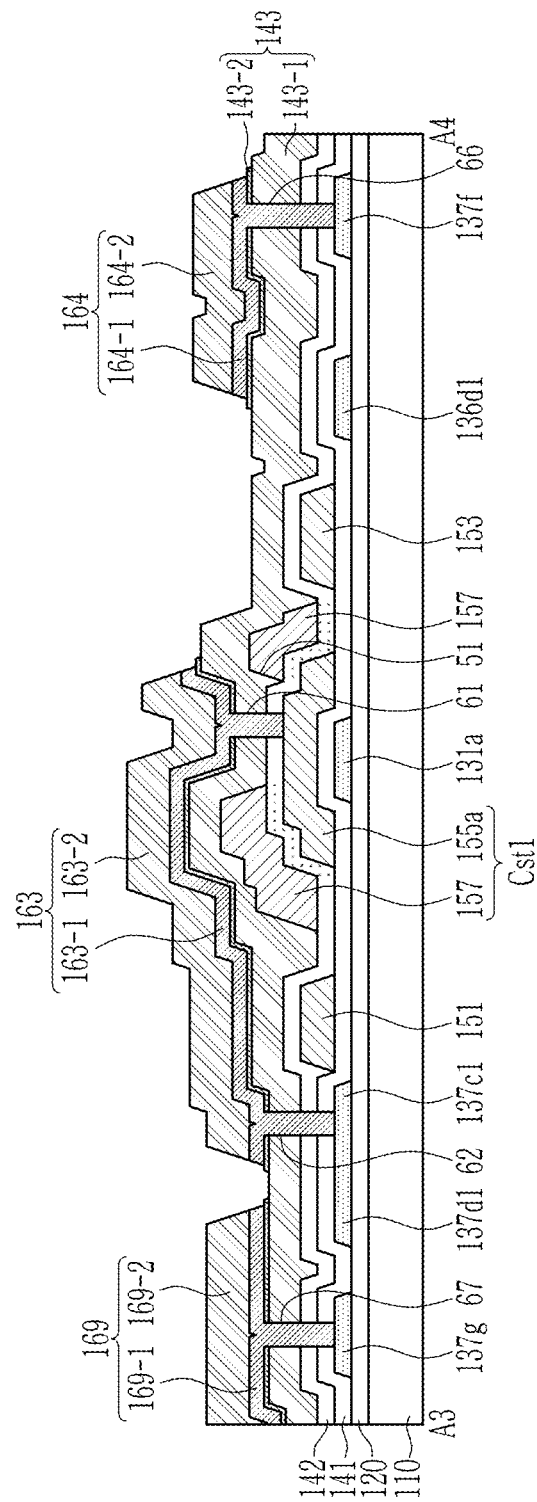

Referring to FIG. 22 to FIG. 24, a conductive material such as an alloy of at least two of copper (Cu), aluminum (Al), molybdenum (Mo), titanium (Ti), and tantalum (Ta) may be stacked on the second sub-insulating material layer 143-*b* and may be patterned to form the third conductive layer (161, 162, 163, 164, and 169) including the initialization voltage line 169 and the connecting members 161, 162, 163, and 164.

According to an embodiment, the third conductive layer (161, 162, 163, 164, and 169) may have at least a dual-layer structure. The third conductive layer (161, 162, 163, 164, and 169) having the dual-layer structure may include different materials. For example, the third conductive layer (161, 162, 163, 164, and 169) may include a lower layer (161-1, 162-1, 163-1, 164-1, and 169-1) containing titanium (Ti) and an upper layer (161-2, 162-2, 163-2, 164-2, and 169-2) containing molybdenum.

The lower layer (161-1, 162-1, 163-1, 164-1, and 169-1) and the upper layer (161-2, 162-2, 163-2, 164-2, and 169-2) included in the third conductive layer (161, 162, 163, 164, and 169) may have different thicknesses. The lower layer (161-1, 162-1, 163-1, 164-1, and 169-1) may be thinner than the upper layer (161-2, 162-2, 163-2, 164-2, and 169-2). For example, the thickness of the lower layer (161-1, 162-1, 163-1, 164-1, and 169-1) may range from about 300 to about 700 angstroms, and the thickness of the upper layer (161-2, 162-2, 163-2, 164-2, and 169-2) may range from about 2200 angstroms to about 2800 angstroms.

A second sub-insulating layer 143-2 may be formed in a process of patterning the third conductive layer (161, 162, 163, 164, and 169).

The third conductive layer (161, 162, 163, 164, and 169) may include the lower layer (161-1, 162-1, 163-1, 164-1, and 169-1) and the upper layer (161-2, 162-2, 163-2, 164-2, and 169-2) that may have different materials. The lower layer (161-1, 162-1, 163-1, 164-1, and 169-1) and the upper layer (161-2, 162-2, 163-2, 164-2, and 169-2) included in the third conductive layer (161, 162, 163, 164, and 169) may be patterned by a same etching process. The lower layer (161-1, 162-1, 163-1, 164-1, and 169-1) and the upper layer (161-2, 162-2, 163-2, 164-2, and 169-2) including different materials may have different etching conditions. Patterning may be performed based on a layer for requiring a larger etching power in order to pattern the lower layer (161-1, 162-1, 163-1, 164-1, and 169-1) and the upper layer (161-2, 162-2, 163-2, 164-2 simultaneously. According to an embodiment, a patterning condition may be set based on the lower layer (161-1, 162-1, 163-1, 164-1, and 169-1) including titanium (Ti).

In a case that the lower layer (161-1, 162-1, 163-1, 164-1, and 169-1) and the upper layer (161-2, 162-2, 163-2, 164-2, and 169-2) having different etching levels may patterned in a same process, a region of the second sub-insulating material layer 143-2 overlapping or facing the third conductive layer (161, 162, 163, 164, and 169) may not be etched because of the third conductive layer (161, 162, 163, 164, and 169) serving as a mask, and a region thereof which does not overlap or face the third conductive layer (161, 162, 163, 164, and 169) may be removed by the etching process as a result of being exposed by the third conductive layer (161, 162, 163, 164, and 169). The second sub-insulating layer 143-2 may be formed to have a substantially same planar shape as the third conductive layer (161, 162, 163, 164, and 169). In other words, the edges of the second sub-insulating layer 143-2 and the third conductive layer (161, 162, 163, 164, and 169) may be formed to substantially overlap or face each other. Edges of the second sub-insulating layer 143-2 and the third conductive layer (161, 162, 163, 164, and 169) may be formed to substantially overlap or face each other along a thickness direction of the display device. As another example, an edge of the second sub-insulating layer 143-2 and an edge of the third conductive layer (161, 162, 163, 164, and 169) may be substantially parallel in the thickness direction of the display device.

The thickness of the second sub-insulating layer 143-2 may be greater than or equal to about 900 angstroms or more, but less than or equal to about 1400 angstroms. In a case that the thickness of the second sub-insulating layer 143-2 may be less than about 900 angstroms, the first sub-insulating layer 143-1 may be damaged after the portion of the second sub-insulating layer 143-2 that is exposed by the third conductive layer (161, 162, 163, 164, and 169) is completely removed, or otherwise, an insulation layer having a non-uniform thickness may be provided in the case where the first sub-insulating layer 143-1 is etched. In a case that the thickness of the second sub-insulating layer 143-2 may be greater than about 1400 angstroms, the second sub-insulating layer 143-2 may not be completely removed, and some of the second sub-insulating layer 143-2 may remain in some regions in the etching process of forming the third conductive layer (161, 162, 163, 164, and 169). This may also result in providing an insulating layer of an uneven thickness.

According to an embodiment, an etching rate of the second sub-insulating layer 143-2 for the same etching condition may be greater than that of the lower layer (161-1, 162-1, 163-1, 164-1, and 69-1) of the third conductive layer (161, 162, 163, 164, and 169). The second sub-insulating material layer 143-b exposed by the third conductive layer (161, 162, 163, 164, and 169) may be easily patterned in the process of etching the third conductive layer (161, 162, 163, 164, and 169).

For the same etching condition, the etching rate of the first sub-insulating layer 143-1 may be lower than that of the second sub-insulating layer 143-2, and may be lower than that of the lower layer (161-1, 162-1, 163-1, 164-1, and 169-1) of the third conductive layer (161, 162, 163, 164, and 169). In the region exposed by the third conductive layer (161, 162, 163, 164, and 169), the first sub-insulating layer 143-1 may be exposed to the etching process after the second sub-insulating layer 143-2 is patterned. However, since the etching rate of the first sub-insulating layer 143-1 is relatively low, a certain thickness may be maintained without being etched during a predetermined etching process.

The second sub-insulating layer 143-2 may include a silicon nitride, the first sub-insulating layer 143-1 may include a silicon oxide, and the lower layer may include titanium (Ti). A predetermined etchant used in the process of patterning the lower layer (161-1, 162-1, 163-1, 164-1, and 169-1) containing titanium may form the second sub-insulating layer 143-2 while simultaneously etching the lower layer (161-1, 162-1, 163-1, 164-1, and 169-1). Since the etching rate of the first sub-insulating layer 143-1 after the second sub-insulating layer 143-2 is formed is relatively low, the first sub-insulating layer 143-1 may not be etched.

Unlike the embodiment herein, i.e., in a comparative example, an undercut may occur in the third conductive layer (161, 162, 163, 164, and 169) when the etching rate of the first sub-insulating layer 143-1 is relatively greater than that of the lower layer (161-1, 162-1, 163-1, 164-1, and 169-1) and the etching rate of the second sub-insulating layer 143-2 is lower than that of the lower layer (161-1, 162-1, 163-1, 164-1, and 169-1).

For example, in the process of patterning the lower layer (161-1, 162-1, 163-1, 164-1, and 169-1) of the third conductive layer (161, 162, 163, 164, and 169), in a case that the etching rate of the lower layer (161-1, 162-1, 163-1, 164-1, and 169-1) may be greater than that of the second sub-insulating material layer 143-b, the lower layer (161-1, 162-1, 163-1, 164-1, and 169-1) itself may be continuously etched instead of etching the second sub-insulating material layer 143-b having a relatively low etching rate, and thus the third conductive layer (161, 162, 163, 164, and 169) may include an undercut, which may cause a wiring failure.

Figure 25:
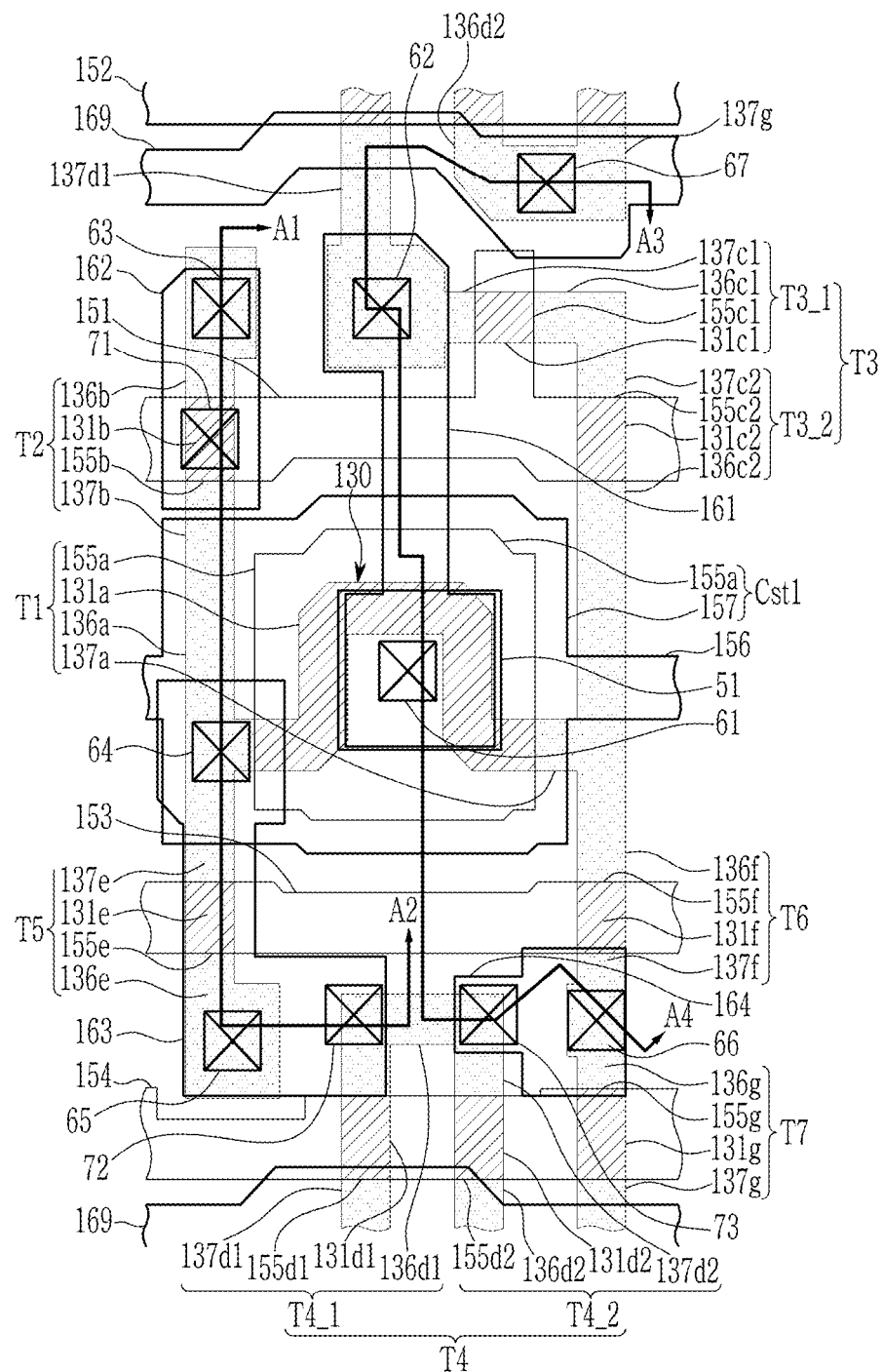
Figure 26:
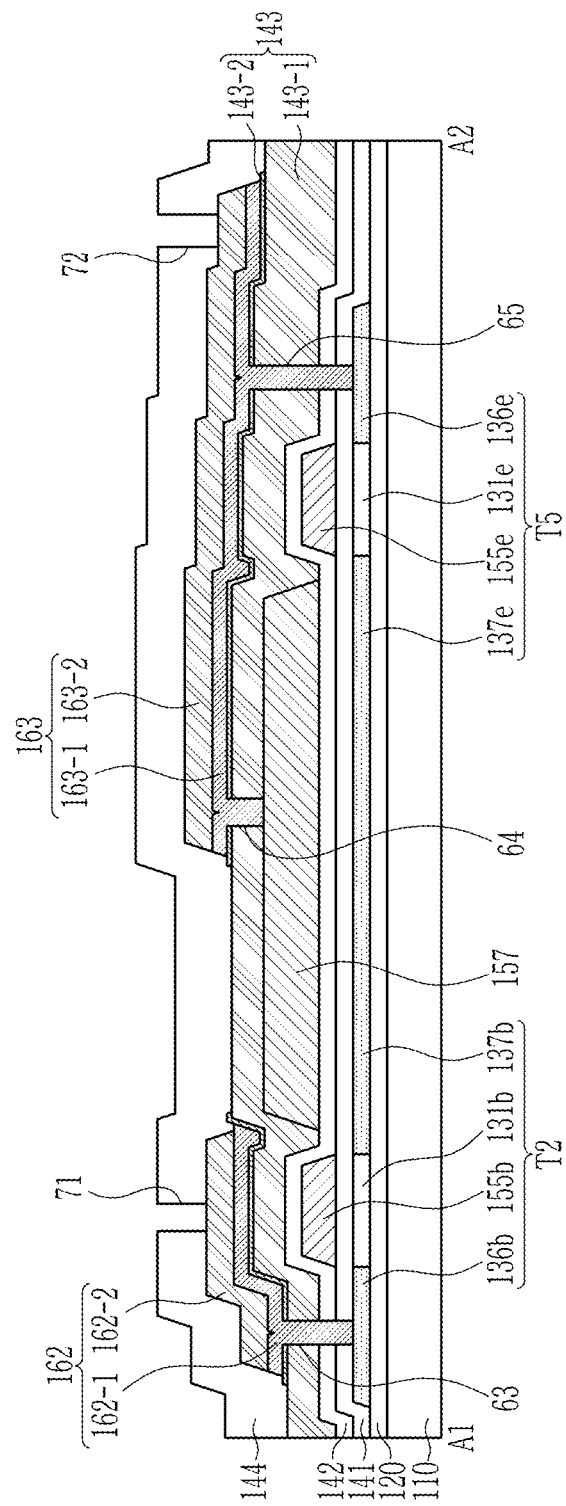
Figure 27:
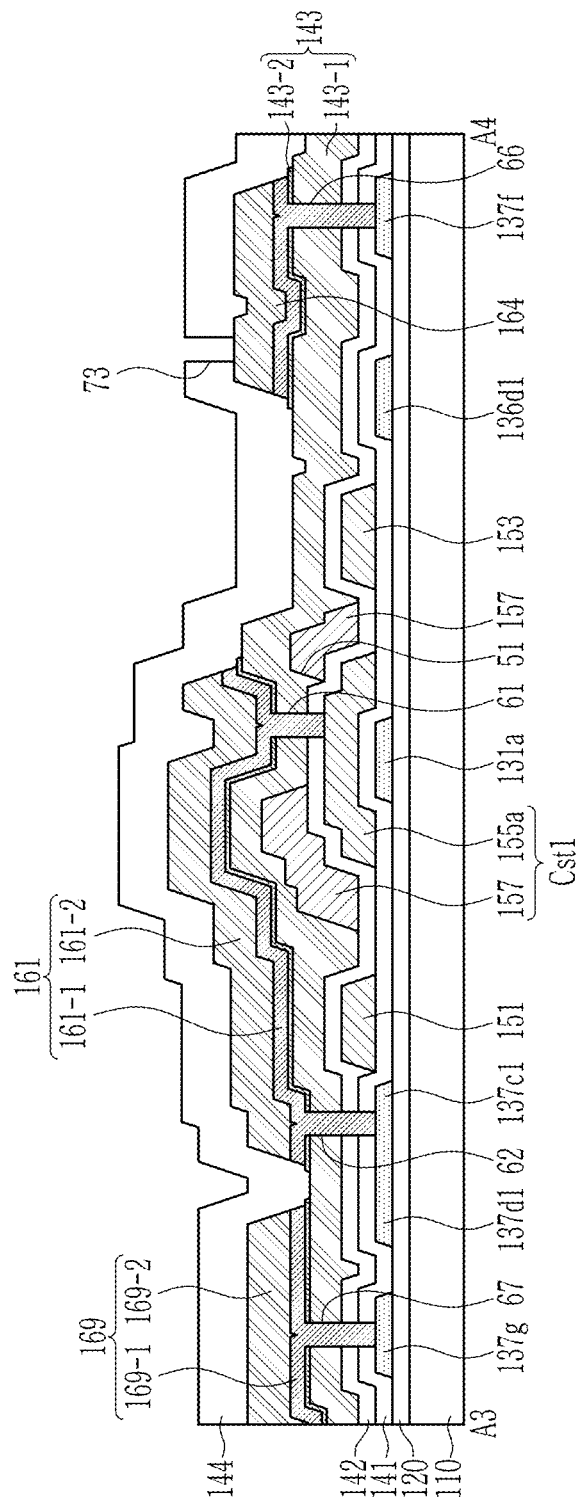

Referring to FIG. 25 to FIG. 27, the fourth insulating layer 144 may be formed by stacking an inorganic insulating material such as a silicon nitride and a silicon oxide and/or an organic insulating material on the third insulating layer 143 and the third conductive layer (161, 162, 163, 164, and 155a). The fourth insulating layer 144 may have the contact holes 71, 72, and 73 that may be patterned by a photolithography process or the like.

Figure 28:
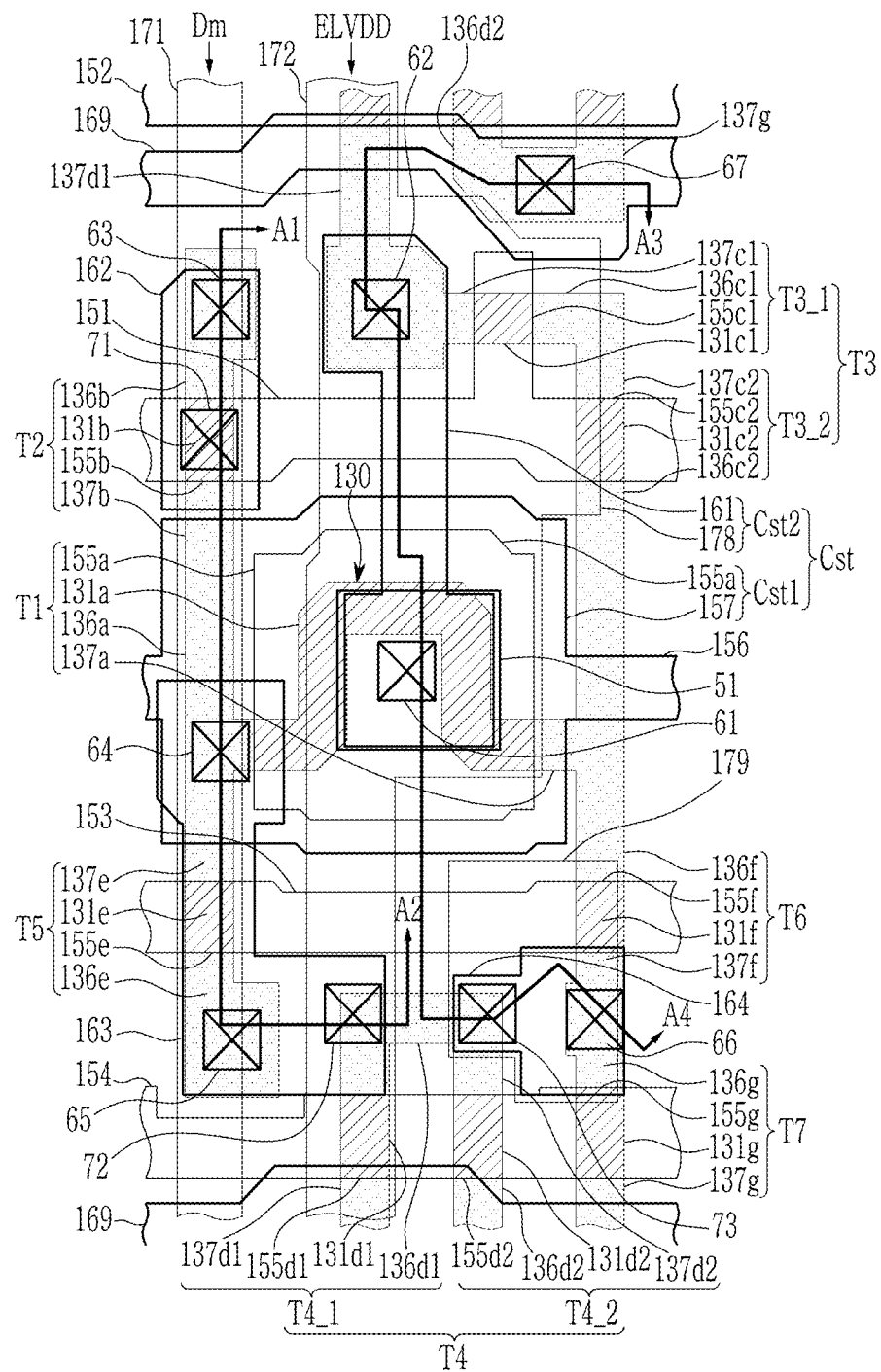
Figure 29:
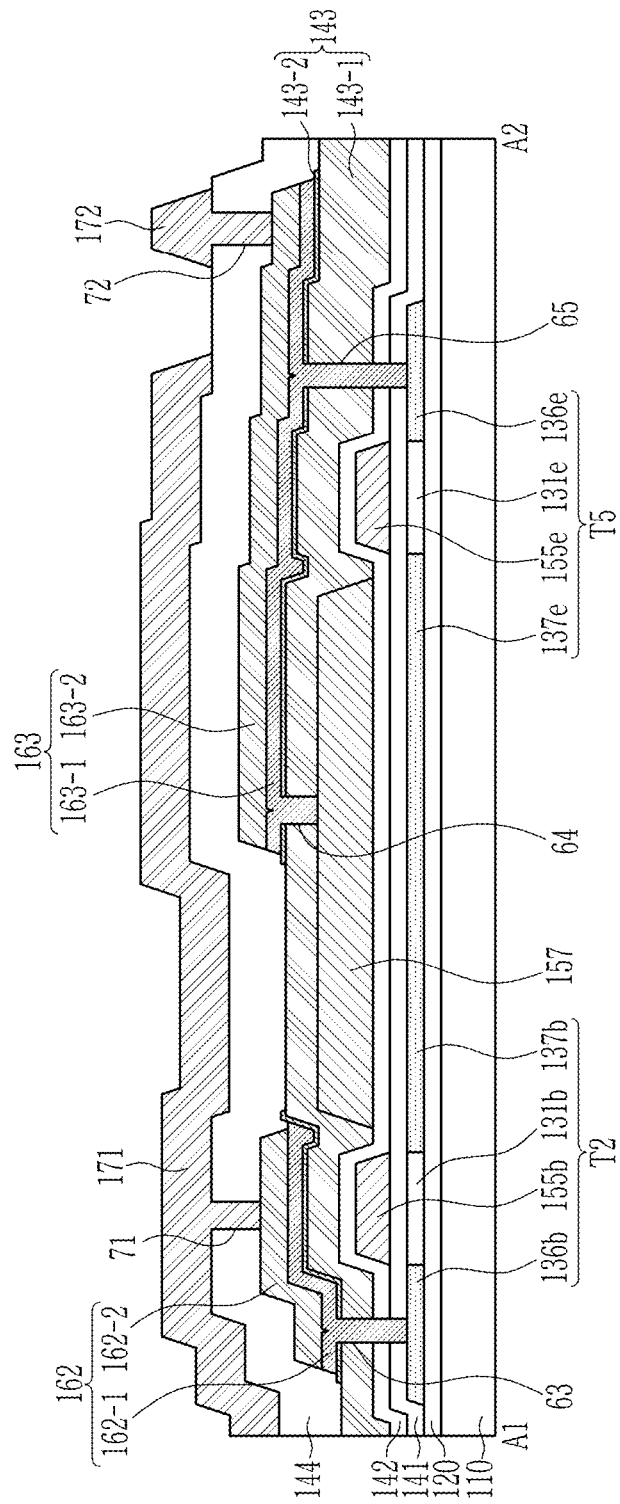
Figure 30:
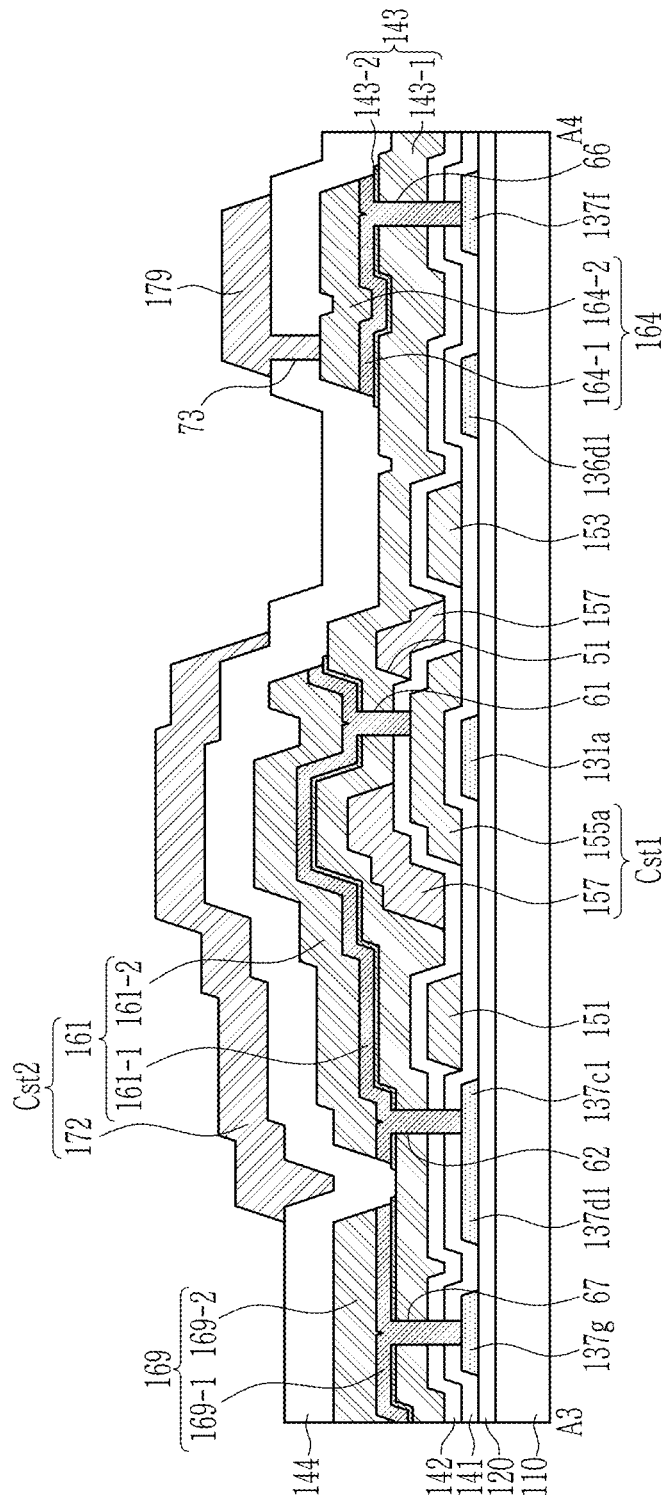

Referring to FIG. 28 to FIG. 30, a conductive material such as copper (Cu), aluminum (Al), molybdenum (Mo), titanium (Ti), tantalum (Ta), or an alloy of at least two thereof may be stacked on the fourth insulating layer 144 and may be patterned to form the fourth conductive layer (171, 172, and 179) including the data line 171, the driving voltage line 172, and the connecting member 179.

Referring to FIG. 2 to FIG. 4, the passivation layer 180 may be formed by stacking an organic insulating material or an inorganic insulating material on the fourth conductive layer (171, 172, and 179) and the fourth insulating layer 144 and patterning it, to form the contact hole 89 on the connecting member 179.

A conductive material such as ITO may be stacked on the passivation layer 180 and may be patterned to form the fifth conductive layer 191 including the pixel electrodes 191. The partition wall 350 may be formed on the pixel electrode 191 and the passivation layer 180, and the emission layer 370 and the common electrode 270 may be sequentially formed to form the light emitting diode ED. A sealing layer (not shown) for sealing the light emitting diode ED may be further formed.

Figure 31:
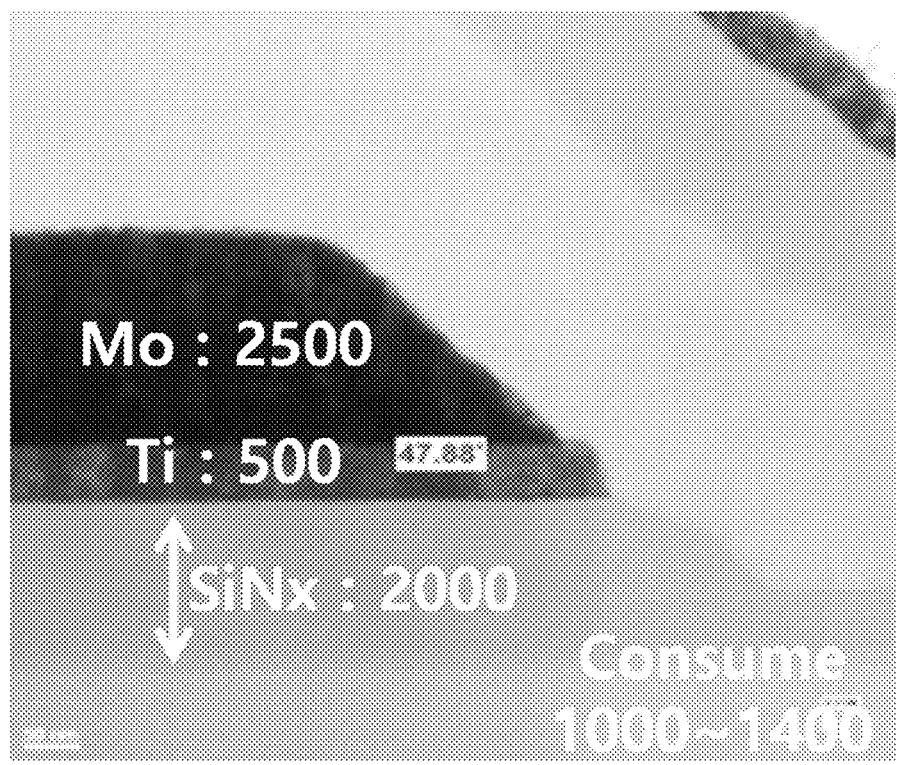
FIG. 31 illustrates a cross-sectional view image of a region of a display device according to a comparative example.

FIG. 31 illustrates an image when the second sub-insulating layer may have a thickness of about 2000 angstroms according to a comparative example that is unlike embodiments herein. Referring to FIG. 31, it may be seen that a second sub-insulating layer having a thickness of 2000 angstroms disposed under titanium (Ti) and including a silicon nitride may be etched in a process of patterning a third conductive layer including molybdenum (Mo) and titanium (Ti). However, it is confirmed that the second sub-insulating layer including the silicon nitride is not completely etched and only about 1000 angstroms to about 1400 angstroms are etched in the region exposed by the third conductive layer.

Figure 32A:
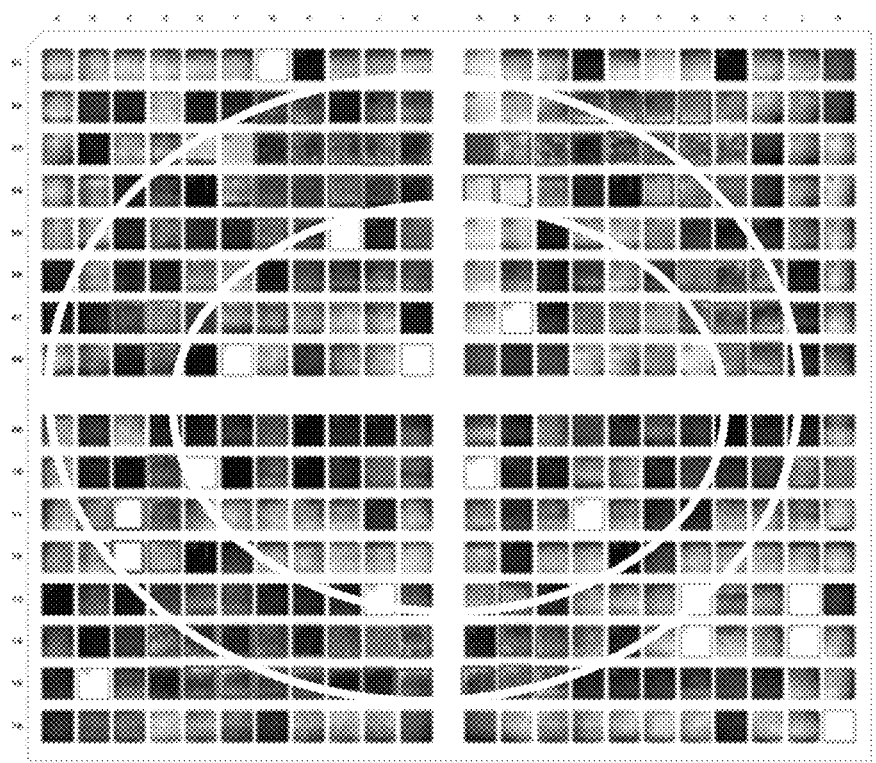
FIG. 32A illustrates a plan view image in a manufacturing process of a display device according to a comparative example.

Referring to FIG. 32A, it may be seen that the second sub-insulating layer may be partially etched as in FIG. 31, and in particular, the degree of etching is considerably non-uniform (e.g., a region between inner and outer circles).

Figure 32B:
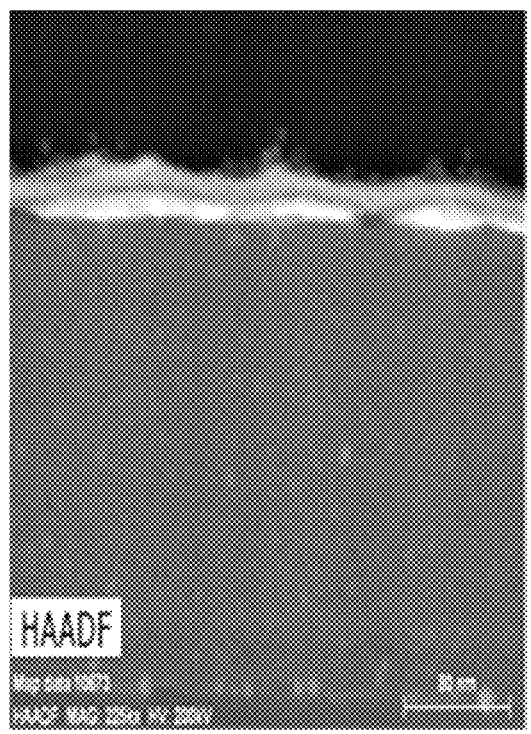
FIG. 32B and FIG. 32C illustrate cross-sectional view images in a manufacturing process of a display device according to a comparative example.
Figure 32C:
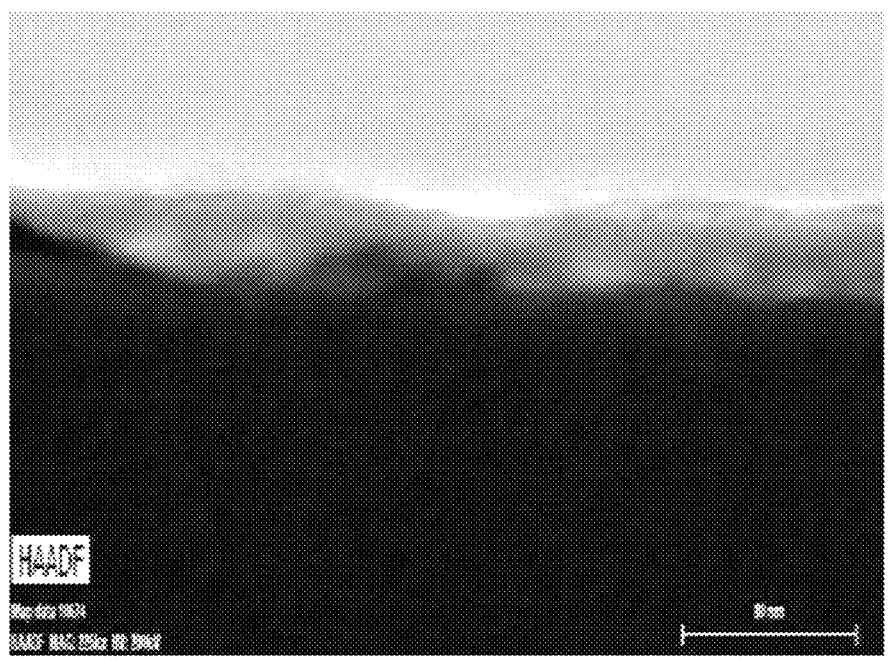

FIG. 32B illustrates a cross-sectional image of a portion of a pixel disposed in the aforementioned region (i.e., the region between the inner and outer circles) in FIG. 32A. A thickness of the second sub-insulating layer was found to be about 1040 Å±160 Å. FIG. 32C illustrates a cross-sectional image of a portion of a pixel disposed in a region that is other than the region in FIG. 32A. In FIG. 32C, a thickness of the second sub-insulating layer was found to be about 1037 Å±21 Å. As a result, it may be seen that the thickness of the second sub-insulating layer is significantly non-uniform in the aforementioned region (i.e., the region between the inner circle and the outer circle). This non-uniform thickness of the insulating layer may undesirably result in emboss staining.

According to embodiment herein, however, in order to prevent emboss stains from appearing, the display device may include a process of completely etching the second sub-insulating layer exposed by the third conductive layer, and thus the edge of the second sub-insulating layer and the edge of the third conductive layer may be provided to be substantially parallel with each other to overlap or face each other along the thickness direction of the display device.

Figure 33:
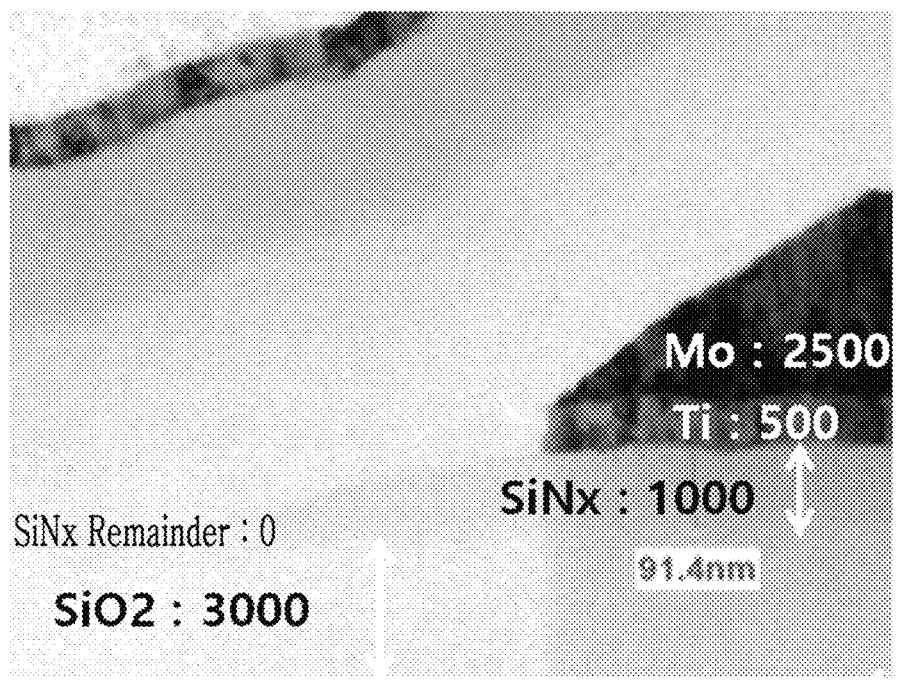
FIG. 33 illustrates a cross-sectional view image of a region of a display device according to an embodiment herein.

As illustrated in FIG. 33, it may be seen that the second sub-insulating layer including a silicon nitride may have a thickness of about 1000 angstroms, and the second sub-insulating layer exposed by the third conductive layer may be completely etched in the process of etching the third conductive layer. It may be confirmed that the first sub-insulating layer exposed by the second sub-insulating layer and including a silicon oxide may not be damaged at all by selectivity of the etchant. According to an embodiment, it may therefore be possible to provide a display device having improved display quality by providing an insulating layer having a uniform thickness.

Figure 34A:
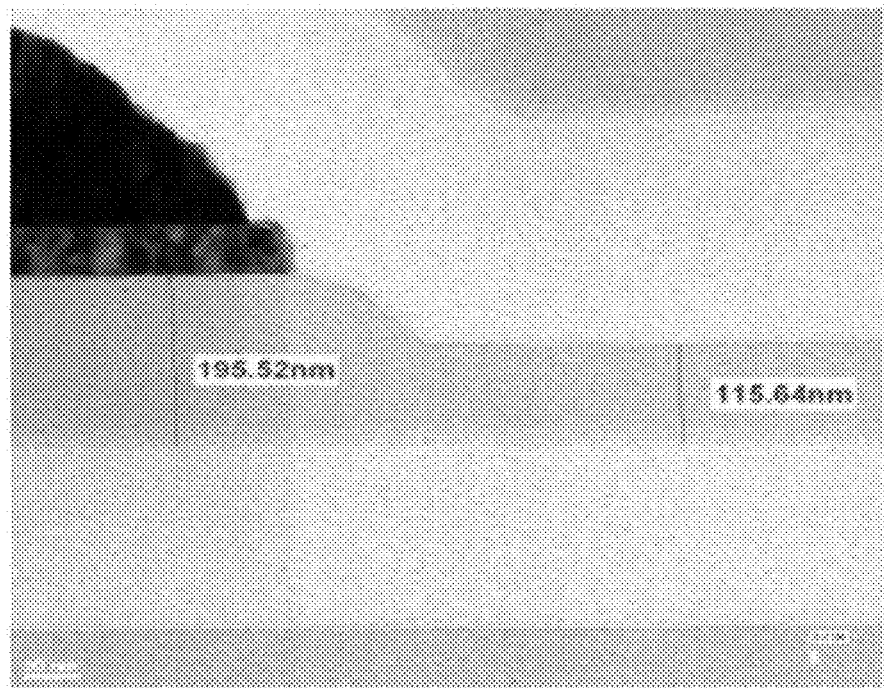
FIG. 34A, FIG. 34B, and FIG. 34C illustrate cross-sectional view images of a region of a display device according to a comparative example.
Figure 34B:
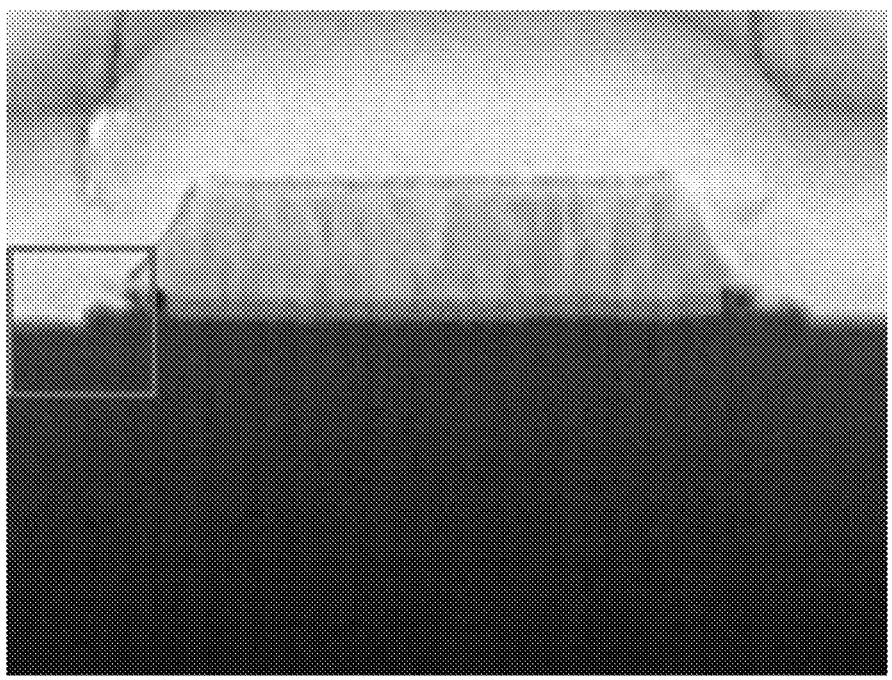
Figure 34C:
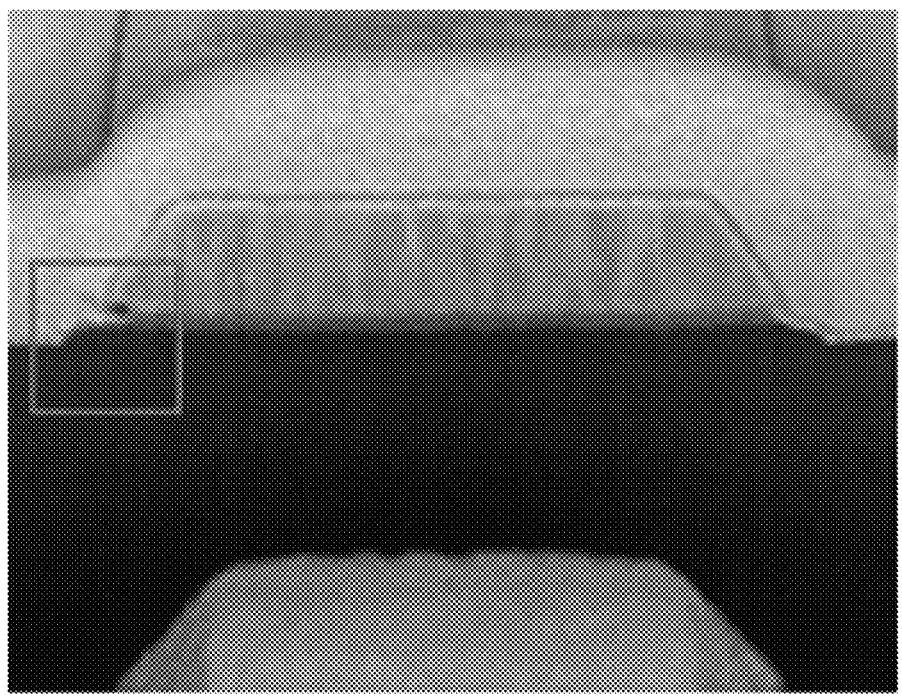
Figure 34D:
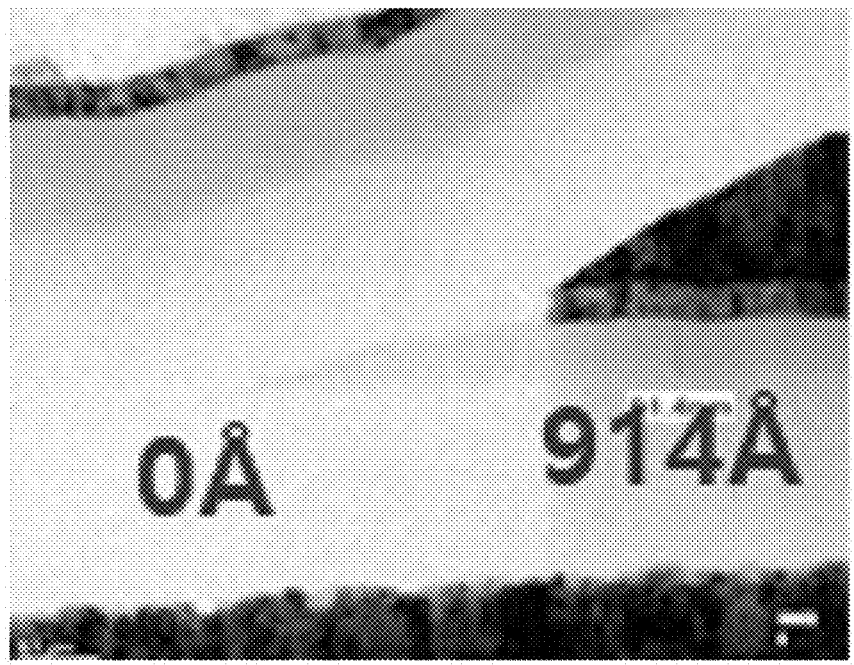
FIG. 34D illustrates a cross-sectional view image of a region of a display device according to an embodiment herein.

Referring to FIG. 34A to FIG. 34D, FIG. 34A illustrates a comparative example in which the upper layer included in the third conductive layer may be formed of Mo to have a thickness of 2500 Å, the lower layer may be formed of Ti to have a thickness of 500 Å, the first sub-insulating layer may be formed of $SiO_2$ to have a thickness of 3000 Å, and the second sub-insulating layer may be formed of SiNx to have a thickness of 2000 Å. FIG. 34B illustrates a comparative example in which the upper layer included in the third conductive layer may be formed of Mo to have a thickness of 2500 Å, and the lower layer may be formed of Ti to have a thickness of 500 Å, and including an insulating layer in which $SiO_2$, SiNx, and $SiO_2$ are stacked in that order from the bottom to have thicknesses of 1000 Å, 2000 Å, and 1000 Å, respectively. FIG. 34C illustrates a comparative example in which the upper layer included in the third conductive layer may be formed of Mo to have a thickness of 2500 Å, and the lower layer may be formed of Ti to have a thickness of 300 Å, and including an insulating layer in which SiO2, SiNx, and SiO2 are stacked in that order from the bottom to have thicknesses of 1000 Å, 2000 Å, and 1000 Å, respectively. FIG. 34D illustrates an example in which the upper layer included in the third conductive layer may be formed of Mo to have a thickness of 2500 Å, the lower layer may be formed of Ti to have a thickness of 300 Å, the first sub-insulating layer may be formed of $SiO_2$ to have a thickness of 3000 Å, and the second sub-insulating layer may be formed of SiNx to have a thickness of 1000 Å.

Referring to 34A, it may be seen that SiNx having a thickness of about 2000 Å is not entirely etched. As a result, as described with reference to FIG. 32, there may be a problem in that the etching of the insulating layer becomes non-uniform in some areas and is expressed as stains. Referring to FIGS. 34B and 34C, in a case that the insulating layer adjacent to the conductive layer is formed of $SiO_2$, it may be seen that an undercut occurs in the lower layer containing Ti. This is because the etching selectivity is SiNx>Ti>$SiO_2$, and thus when the second sub-insulating layer is formed of $SiO_2$, the lower layer including Ti may be over-etched. When an undercut occurs in the conductive layer including Ti, driving failure may increase to 30% or more. Referring to FIG. 34D, in a case that the second sub-insulating layer including SiNx may be disposed adjacent to the conductive layer, all of the second sub-insulating layers are etched in a region not overlapping with the conductive layer.

Therefore, according to an embodiment, the second sub-insulating layer may include SiNx having a thickness of at least 1400 Å or at least 1000 Å so as to be fully etched in a region that does not overlap the conductive layer.

While embodiments herein have been described as above, it is to be understood that such embodiments may not be limited to the the provided description, but, on the contrary, such embodiments are intended to cover various modifications and equivalent arrangements included within the spirit and scope of the appended claims.

What is claimed is:

1. A display device, comprising:
   a substrate;
   an active layer disposed on the substrate, and including channel regions and conductive regions;
   a first conductive layer configured to include a driving gate electrode and a scan line extending in a first direction;
   a second conductive layer configured to include a storage line;
   a third conductive layer configured to include a first connecting member, disposed above the storage line;
   an insulating layer disposed between the storage line and the first connecting member; and
   a data line and a driving voltage line each configured to cross the scan line and extend in a second direction, wherein
   the first connecting member electrically connects the driving gate electrode and a conductive region among the conductive regions,
   the driving voltage line overlaps at least a portion of the first connecting member,
   the insulating layer includes a first sub-insulating layer and a second sub-insulating layer, and
   an edge of the second sub-insulating layer substantially overlaps an edge of the third conductive layer in a thickness direction of the display device.

2. The display device of claim 1, wherein
   the edge of the second sub-insulating layer and the edge of the third conductive layer are aligned in the thickness direction of the display device.

3. The display device of claim 1, wherein
   the edge of the second sub-insulating layer and the edge of the third conductive layer are offset in the thickness direction of the display device.

4. The display device of claim 1, wherein
   the third conductive layer includes a second connecting member, a third connecting member, a fourth connecting member, and an initialization voltage line disposed on a same layer as that of the first connecting member.

5. The display device of claim 4, wherein
   the second sub-insulating layer includes:
   a first region configured to overlap the first connecting member;
   a second region configured to overlap the second connecting member;
   a third region configured to overlap the third connecting member;
   a fourth region configured to overlap the fourth connecting member; and a fifth region configured to overlap the initialization voltage line.

6. The display device of claim 5, wherein the first to fourth regions are spaced apart from each other in a plan view.

7. The display device of claim 5, wherein the fifth region extends along the first direction.

8. The display device of claim 1, wherein the first sub-insulating layer and the second sub-insulating layer include different materials.

9. The display device of claim 8, wherein the first sub-insulating layer includes a silicon oxide, and the second sub-insulating layer includes a silicon nitride.

10. The display device of claim 1, wherein a thickness of the first sub-insulating layer is larger than that of the second sub-insulating layer.

11. The display device of claim 10, wherein the second sub-insulating layer has a thickness that is in a range of about 900 angstroms to about 1400 angstroms.

12. The display device of claim 1, wherein the third conductive layer includes a lower layer and an upper layer,
the lower layer includes titanium (Ti), and
the upper layer includes molybdenum (Mo).

13. The display device of claim 1, wherein the edge of the second sub-insulating layer has a tapered shape.

14. The display device of claim 13, wherein the edge of the second sub-insulating layer protrudes more than an edge of the first connecting member.

15. A manufacturing method of a display device, comprising:
forming a semiconductor layer on a substrate;
forming a first conductive layer including a driving gate electrode and a scan line extending in a first direction on the semiconductor layer;
forming a second conductive layer including a storage line on the scan line;
forming a first sub-insulating material layer and a second sub-insulating material layer on the storage line; and
forming a third conductive layer including a first connecting member on the second sub-insulating material layer,
wherein a second sub-insulating layer is formed by etching the second sub-insulating material layer during the forming of the third conductive layer.

16. The manufacturing method of claim 15, wherein the third conductive layer includes a lower layer and an upper layer.

17. The manufacturing method of claim 16, wherein the second sub-insulating material layer is etched during a process of etching the lower layer.

18. The manufacturing method of claim 16, wherein an etching rate of the second sub-insulating material layer is greater than that of the lower layer.

19. The manufacturing method of claim 18, wherein an etching rate of the first sub-insulating material layer is less than that of the lower layer.

20. The manufacturing method of claim 19, wherein the first sub-insulating material layer includes a silicon oxide, and the second sub-insulating material layer includes a silicon nitride.

21. The manufacturing method of claim 16, wherein the third conductive layer further includes a second connecting member, a third connecting member, a fourth connecting member, and an initialization voltage line, and
an edge of the second sub-insulating material layer substantially overlaps edges of each of the second connecting member, the third connecting member, the fourth connecting member, and the initialization voltage line.

22. The manufacturing method of claim 21, wherein the edge of the second sub-insulating material layer is aligned with each of the edges of the second connecting member, the third connecting member, the fourth connecting member, and the initialization voltage line.

23. The manufacturing method of claim 21, wherein the edge of the second sub-insulating material layer is offset from each of the edges of the second connecting member, the third connecting member, the fourth connecting member, and the initialization voltage line.

24. The manufacturing method of claim 16, wherein the second sub-insulating material layer has a thickness that is in a range of about 900 angstroms to about 1400 angstroms.

* * * * *